(12) United States Patent
Sharma

(10) Patent No.: US 11,171,131 B2
(45) Date of Patent: Nov. 9, 2021

(54) MULTI-FINGERED DIODE WITH REDUCED CAPACITANCE AND METHOD OF MAKING THE SAME

(71) Applicant: STMicroelectronics International N.V., Schiphol (NL)

(72) Inventor: Vishal Kumar Sharma, Delhi (IN)

(73) Assignee: STMICROELECTRONICS INTERNATIONAL N.V., Schiphol (NL)

( * ) Notice: Subject to any disclaimer, the term of this patent is extended or adjusted under 35 U.S.C. 154(b) by 120 days.

(21) Appl. No.: 16/544,206

(22) Filed: Aug. 19, 2019

(65) Prior Publication Data

US 2020/0075575 A1 Mar. 5, 2020

Related U.S. Application Data

(60) Provisional application No. 62/724,330, filed on Aug. 29, 2018.

(51) Int. Cl.
*H01L 27/02* (2006.01)
*H01L 29/739* (2006.01)
*H01L 29/417* (2006.01)

(52) U.S. Cl.
CPC ........ *H01L 27/0248* (2013.01); *H01L 29/417* (2013.01); *H01L 29/7391* (2013.01)

(58) Field of Classification Search
None
See application file for complete search history.

(56) References Cited

U.S. PATENT DOCUMENTS

| | | | | |
|---|---|---|---|---|
| 2001/0010404 A1* | 8/2001 | Ker | ................... | H01L 23/5222 257/773 |
| 2006/0244091 A1* | 11/2006 | Kikuchi | ............... | H01L 29/868 257/471 |
| 2011/0233713 A1* | 9/2011 | Son | ....................... | H01L 21/265 257/476 |
| 2013/0075877 A1* | 3/2013 | Sakai | ............... | H01L 29/41725 257/655 |
| 2015/0364463 A1* | 12/2015 | Suzuki | ............... | H01L 27/0255 257/355 |
| 2016/0104767 A1* | 4/2016 | Yamashita | ........ | H01L 29/41708 257/342 |
| 2018/0204913 A1* | 7/2018 | Arnold | .................. | H01L 29/102 |
| 2019/0109242 A1* | 4/2019 | Ramu | .................. | H01L 29/417 |

* cited by examiner

*Primary Examiner* — Michelle Mandala
(74) *Attorney, Agent, or Firm* — Seed IP Law Group LLP

(57) ABSTRACT

A diode and method of design the layout of the same having reduced parasitic capacitance is disclosed. In particular, the diode for providing fast response protection of an RF circuit from a high power noise event, such as an ESD, voltage spike, power surge or other noise is disclose. The parasitic capacitance in disclosed circuit is a greatly reduced compared to the prior art, thus significantly increasing the speed of the response to dissipate all high power noise events.

18 Claims, 37 Drawing Sheets

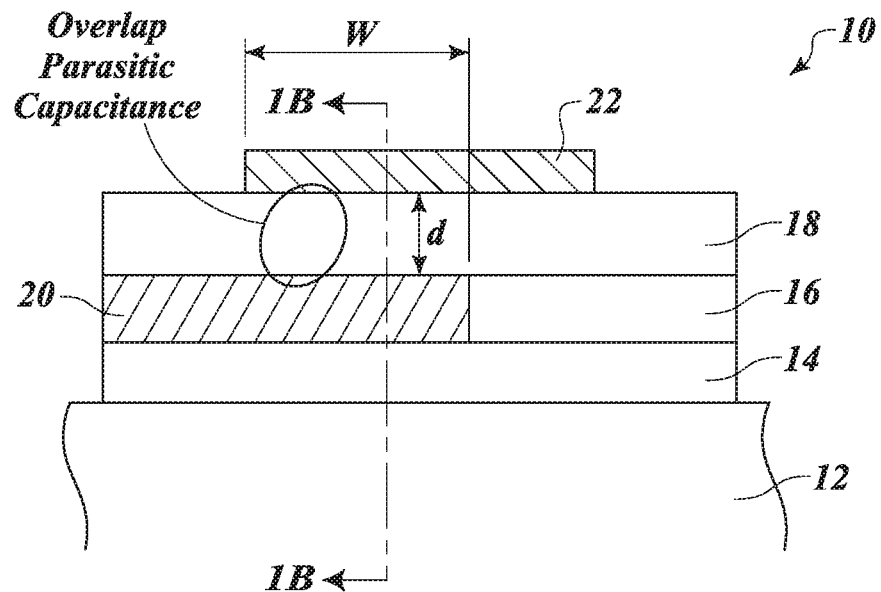
FIG. 1A *(Prior Art)*
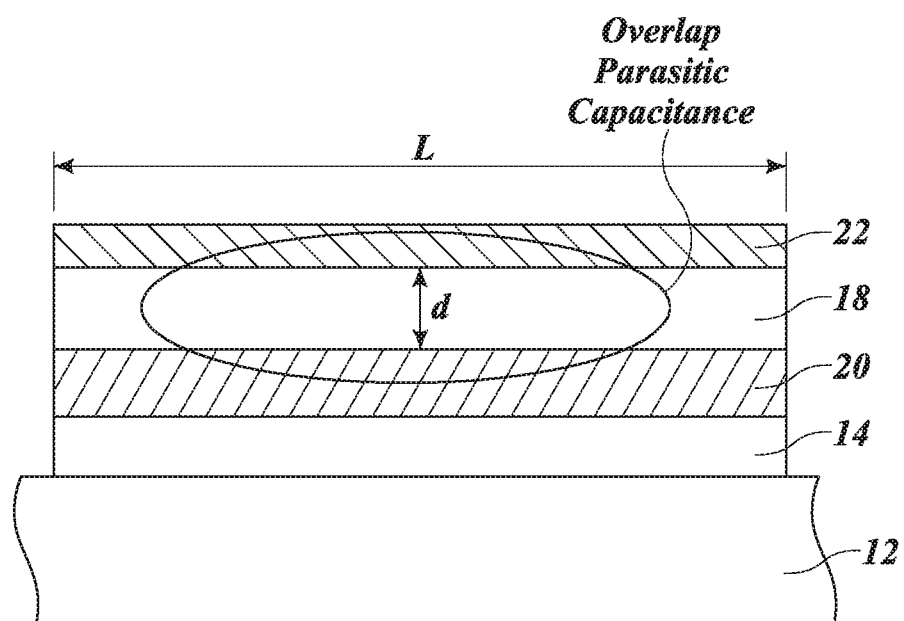
FIG. 1B *(Prior Art)*

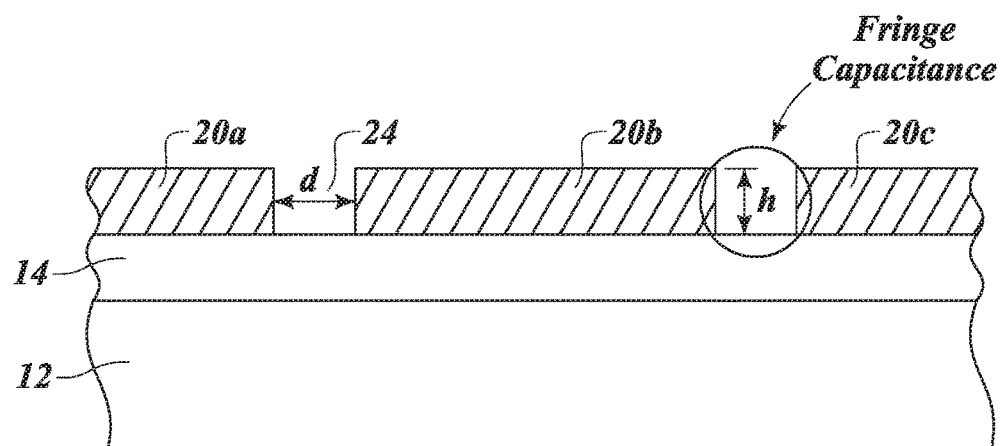
FIG. 2A *(Prior Art)*
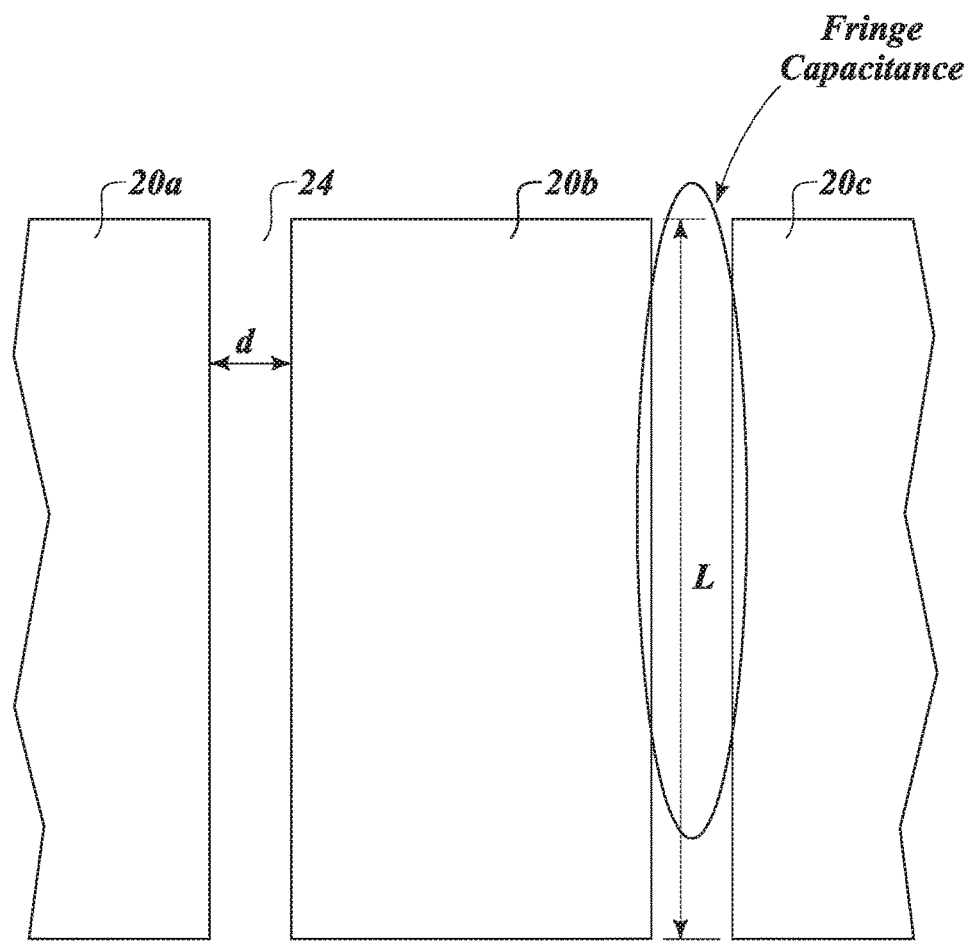
FIG. 2B *(Prior Art)*

MULTI-FINGERED DIODE WITH REDUCED CAPACITANCE AND METHOD OF MAKING THE SAME

BACKGROUND

Technical Field

This disclosure is in the field of multi-fingered diodes, in particular, a diode for use in an ESD protection circuit with reduced capacitance and faster response time to an ESD event.

Description of the Related Art

Diodes are frequently used in semiconductor chips for various purposes. One of the purposes for diodes is to protect against high noise, such as an electrostatic discharge (ESD). To protect the pin (electrical conductor) of the chip which is interacting with external world during an ESD event, two diodes are used such that anode of one diode is connected to the pin and cathode to the supply whereas anode of other diode is connected to ground and cathode to the pin. During normal operation of chip, both diodes remain in the off state (anode being at lower or equal potential as of cathode). However during the ESD event between pin and supply or ground, one or both diodes get turn on as soon as potential across the pin raises above the barrier potential of the diode and discharge the excessive current through to the supply or ground, and thus protect other portions of the circuit from the voltage surge.

In order to operate properly, the diode must respond very quickly to an ESD event. Since ESD an event is a high frequency, or short duration event, the diode might not be able to respond quickly enough if its inherent capacitance or its parasitic capacitance is too high. Particularly, any capacitance that might be present, whether from the inherent structure itself or from the parasitic capacitance will slow down the response of the diode. As the diodes become increasingly larger, with more metal layers and larger surface area in order to dissipate a larger current, the capacitance similarly increases If the capacitance becomes too large, the diode's response time to dissipate charge during an ESD event may not be sufficiently fast in order to protect the rest of the circuit. Accordingly, having a very large diode with the ability to dissipate a large current is not useful if the capacitance is too high.

BRIEF SUMMARY

A diode and method of making the same having reduced parasitic capacitance is disclosed. In particular, the diode for providing fast response protection of an RF circuit from a high power noise event, such as an ESD, voltage spike, power surge or other noise is disclosed. The parasitic capacitance in disclosed circuit is a greatly reduced compared to the prior art, thus significantly increasing the speed of the response to dissipate all high power noise events.

According to principles of the present disclosure, overlapping metal layers, which are biased at different voltage potentials, are greatly reduced, and, in some embodiments, are not present. Accordingly, overlapping parasitic capacitance is reduced or, in some instances, is zero. In addition, the fringe capacitance, which may occur with adjacent metal layers, is greatly reduced by using reduced area vias at selected locations connected to the anode electrode, in one embodiment. In other embodiments, the cathode electrode is divided into individual segments, and spaced apart from the anode electrode to further reduce fringe capacitance.

In some embodiments, the space between adjacent metal members in the same metal layer is increased in order to increase the distance between them, which reduces any effects of a fringe capacitance. In other embodiments, the position of the metal members at the same metal level is selected to avoid locations in which the metal members are adjacent to each other with a dielectric in-between, in order to greatly reduce and, in some instances, completely prevent the occurrence of any fringe parasitic capacitance.

In a preferred embodiment, all metal levels that connect to the doping level in the substrate are exactly on top of each other, and interconnected with vias, to ensure that all metal levels that overlap are at the same voltage level at all times, thus preventing any capacitance between them.

In one embodiment, a diode is designed on a semiconductor substrate. A cathode region is positioned in the semiconductor substrate. An anode region is also positioned in the semiconductor substrate and substantially surrounding the cathode region, the anode region adjacent to the cathode region. A first insulation layer is directly over the semiconductor substrate. A cathode electrode having the same footprint area as the cathode region and that directly overlays the entire cathode region, the cathode electrode is being composed of a first metal layer and being in electrical contact with the cathode.

An anode electrode having substantially the same footprint area as the anode region and that directly overlays substantially the entire anode region, the anode electrode is being composed of the first metal layer being in electrical contact with the anode. A second insulation layer directly over the cathode and anode electrodes first metal layer and, a second metal layer on the second insulation layer, the second metal layer having a first portion that directly overlays the entire cathode electrode and a plurality second portions, each portion having a selected width, each second portion being spaced from each other second portion a selected distance; each of the second portions having a region that directly overlies the anode electrode and a region that overlies the substrate at a location where the anode electrode is not present.

According to one embodiment, a diode is designed on a semiconductor substrate. Both a cathode and anode region are positioned in the semiconductor substrate. A first insulation layer is directly over the semiconductor substrate. A cathode electrode having a plurality of portions spaced from each other, each cathode electrode portion having a selected width and being spaced from each other cathode electrode portion by a selected distance, each of the cathode electrode portions being in electrical contact with the cathode and being composed of a first metal layer. An anode electrode is also provided having substantially the same footprint area as the anode region and that directly overlays substantially the entire anode region, the anode electrode being composed of the first metal layer and being in electrical contact with the anode.

In one embodiment, there is a second insulation layer over the cathode and anode electrodes and a second metal layer on the second insulation layer. The second metal layer has a plurality of first portions spaced from each other, each first portion of the second metal layer having the selected first width and being spaced from each other the selected first distance, each of the first portions of the second metal layer being in electrical contact with the anode electrode and a second portion having substantially the same footprint area as the cathode and that directly overlays substantially the entire cathode, the second portion being composed of the second metal layer and being in electrical contact with the cathode electrode over the selected width region.

According to yet another embodiment, a diode is designed in a semiconductor substrate. There is a cathode region positioned in the semiconductor substrate and an anode region positioned in the semiconductor substrate. There is a first insulation layer directly over the semiconductor substrate. There is cathode electrode in electrical contact with the cathode and being composed of a first metal layer. Each cathode electrode has a contact portion that has a first selected width and being spaced from each other cathode electrode contact portions by a first selected distance with a cathode open space region between each cathode electrical contact portion. There is an anode electrode having a plurality anode contact portions, each anode contact portion having a selected width, each anode contact portion being spaced from each other anode contact portion by a selected anode spacing distance, each of the anode contact portions being directly over the anode, each of the anode contact portions being offset from each of the cathode contact portions and adjacent to the cathode open space region.

BRIEF DESCRIPTION OF THE SEVERAL VIEWS OF THE DRAWINGS

FIG. 1A is a side view of two conductive layers which have an overlapping parasitic capacitance.

FIG. 1B is a cross-sectional view taken along line 1B-1B of FIG. 1A.

FIG. 2A is a side view of adjacent metal layers having a fringe capacitance.

FIG. 2B is a top plan view of FIG. 2A.

DETAILED DESCRIPTION

Figure 3A:
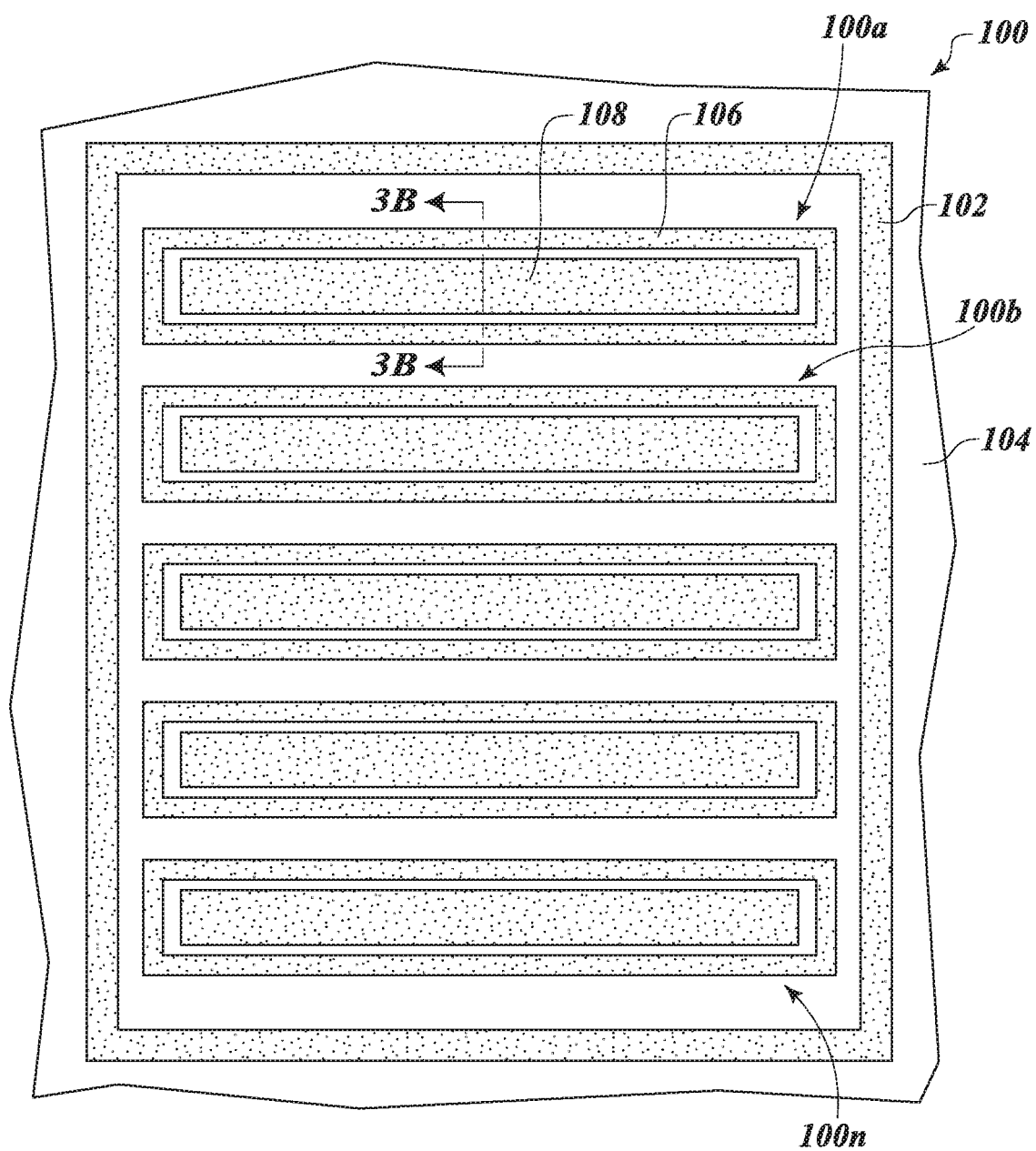
FIG. 3A is a semiconductor substrate having a multi-fingered diode according to principles of the disclosure.

FIGS. 1A and 1B illustrate overlap parasitic capacitance that occurs in a semiconductor integrated circuit 10. A standard integrated circuit 10 includes a number of layers on a substrate 12. In particular, the integrated circuit includes a substrate 12 which, in some embodiments, is a semiconductor and contains doped areas and in other embodiments is a glass, sapphire, plastic, or other substrate. Overlying the substrate 12 is an insulating layer 14. Above the insulating layer 14 is an interconnection metal layer 20. The interconnection layer 20 can be a power supply line, such as for high positive voltage, ground, negative voltage, or other power supply line. It may also be a signal line that carries data to various locations on the circuit. An insulation layer 16 is adjacent to the conductor 20 to electrically isolate it from other conductors at the same level. An insulation layer 18 is above the interconnection layer 20 and on top of it is another metal conductor 22. Of course, the conductors 20, 22 can be made of other material besides metals, for example, highly doped polysilicon or other interconnection layers that are electrically conductive.

Interconnection layer 22 may also carry a power supply voltage, such as a positive power supply, ground, or negative power supply, as well as any number of data signals, whether positive or negative voltages.

As is known, the value of a parallel plate capacitor is given by the following equation:

$$C = k\frac{A}{d} \quad \text{Equation 1}$$

In the above equation, capacitance is given in farads. k includes the dielectric constant and others, A is the area of the plates, and d is the distance between the plates. As can be seen looking at FIGS. 1A and 1B, the distance between the plates is given by d, which is the thickness of insulating layer 18. The value of k will depend on the type of material for insulating layer 18, as well as other constant values as is well known for capacitors. The area is the amount of overlap of the distance W, as shown FIG. 1A, multiplied by the length of the overlap perpendicular to W, as shown in FIG. 1B. In particular, the area of the overlap between plates 20 and 22 is W*L which is the area that the conductors 22 and 22 overlap with each other.

Any time there is a difference in voltage on plates 20, 22, the capacitor having a value given by the above Equation 1 will affect the circuit operation. Even if the width W is relatively small, if the length L is extremely long, then the area can become quite significant. This can create a large capacitor in which the interconnection lines 20, 22 act as the plates of the capacitor with layer 18 being the dielectric in between them. Any time signals propagate along either conductor 20 or 22, the overlap parasitic capacitance which exists between them, as shown in FIGS. 1A and 1B, will impact the signal propagation. It will slow the signal propagation and, in some instances, may act as a filter to filter out significant data which is desired to be carried in the signals which travel along lines 20, 22. The unwanted overlap parasitic capacitance may create additional problems at high frequencies. Since the response of a capacitor varies greatly over frequencies, the problems caused by an overlap parasitic capacitance can vary greatly for different circuits. In addition, the voltage levels on the respective interconnection lines 20, 22 may vary greatly. In some instances, the voltage in one interconnection line may go extremely high while the voltage in the other line goes extremely low, in which case the problems caused by the parasitic capacitance increase even further.

FIGS. 2A and 2B illustrate a further prior art problem of fringe parasitic capacitance. It may be considered that fringe capacitance is a type of parasitic capacitance; however, for illustration purposes, they are both introduced, one as the overlap parasitic capacitance for two conductive layers that overlay each other along the widths and a fringe parasitic capacitance for two conductive layers that run in a parallel direction near each other in same or different metal levels.

As seen in FIGS. 2A and 2B, various conductors 20*a*, 20*b*, 20*c* may be adjacent to each other on the same level with the insulation layer 16 in between them. These conductors 20*a*, 20*b* are separated by a distance 24 as shown by the letter d in FIGS. 2A and 2B. In this instance, the insulation layer 16 acts as the dielectric material and its properties will have an impact on the value of the capacitor formed by the interconnection lines 20*a*, 20*b*. The height of each line 20*a*, 20*b*, as shown in FIG. 2A, can be multiplied by the length of the line, as shown in FIG. 2B, to give the overall area of the capacitive interaction between adjacent metal lines 20*a*, 20*b*, 20*c*, as shown in the capacitance equation. Even though h can be quite small, the parallel run length L as the interconnection lines extend over a region, can be quite large. Accordingly, since the area is given by the equation h*L, this can result in a somewhat large area for a capacitor. Thus, the fringe capacitance depending on its value may also create same problems as might also occur with an overlap capacitance in affecting the operation of the circuit. In particular, signals that travel through the interconnection lines 20*a*, 20*b*, and 20*c* may be substantially impacted by the fringe capacitance.

As can be appreciated, the fringe capacitance, while a type of parasitic capacitance as shown in FIGS. 2A and 2B, is generally much less than the overlap parasitic capacitance of the type shown in FIGS. 1A and 1B. This is generally because the area is usually much smaller in a fringe capacitance. For example, the thickness of conductors 20*a*, 20*b*, 20*c* may be on the order of nanometers, where the width W, as shown in FIG. 1A, might, in some instances, be on the order of many hundreds of nanometers or even microns.

The response of a circuit is greatly affected based on the sum of all capacitance within the circuit. This includes fringe capacitance, overlap parasitic capacitance, substrate capacitance and all other capacitance which may inadvertently occur in the circuit. There may also be additional capacitance due to interaction between one or more of the interconnection lines 20, 22 and a doped area in the substrate 12. In addition, as further interconnection layers extend above the layers 20, 22, more parasitic capacitance may occur within the circuit. Accordingly, a circuit design which reduces the overall parasitic capacitance is advantageous to use in a number of situations.

Figure 3B:
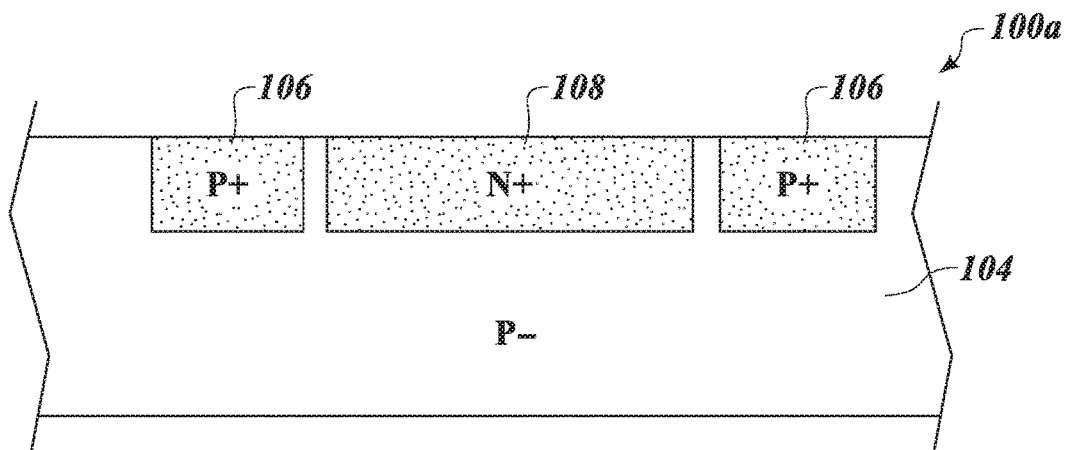
FIG. 3B is a cross-sectional view taken along line 3B-3B of FIG. 3A according to one embodiment.

FIGS. 3A-3D illustrate a diode 100 for which the parasitic capacitance is greatly reduced according to principles as disclosed herein. This diode bank 100 includes a cathode 108 as an N+ region. An anode 106 surrounds the cathode 108. In this embodiment, the cathode 108 is N+ type semiconductor, as shown in FIG. 3B, the anode 106 is P+ type semiconductor, and the diode bank 100 is formed in a substrate 104 which is very lightly doped P-type semiconductor. A bank of diodes 100, in this example five diodes 100a-100n, are formed as a group in order to operate as a single large diode. Namely, the diodes 100a-100n, are coupled together in parallel so that all the cathodes and anodes operate as one to provide a very large area diode 100. A NW guard ring 102 completely surrounds this diode bank of five individual diodes 100a-100n which are banked together to make a single large diode. In a preferred embodiment, the guard ring 102 is a heavily doped N-type semiconductor; An NWELL guard ring along with deep-NWELL (DNW) is used to create an isolated PWELL substrate in those cases when anode being P+ type is biased to a potential other than that of the substrate potential. FIG. 3B is a cross section taken along lines 3B-3B of FIG. 3A according to one embodiment. According to a first embodiment, the cathode 108 is in a central region having a selected volume, and the anode 106 extends on either side of the cathode 108, with the volume of the anode 106 being approximately equal to the total volume of the cathode 108. As can be seen in FIG. 3B, since the anode 106 is on either side of the cathode, it will be approximately half as wide at each location, and the sum of the entire anode is substantially the same as the volume of the entire cathode 108.

In the embodiment of FIG. 3B, the substrate 104 is lightly doped P-type, and there is a small space between the anode 106 and the cathode 108. This provides additional electrical isolation besides the junction isolation between a P-type and N-type semiconductor material. The distance between the cathode 108 and the anode 106 can be selected to determine the operation threshold of the diode. For a small distance, the turn-on resistance of the diode is small and increases with the distance. Alternatively, the level of doping and the P-type substrate 104 can also affect the turn-on characteristics of the diode. In the embodiment of FIG. 3B, the distance between the anode and cathode are selected to provide a small turn-on resistance of the diode when diode is forward biased. In one embodiment, the diode's forward biased turn on voltage is selected to be in the range of 0.7-0.8 volts. In other embodiments, the distance in doping levels is selected to have the turn-on threshold to be in the range of 1.0-1.2 volts.

Figure 3C:
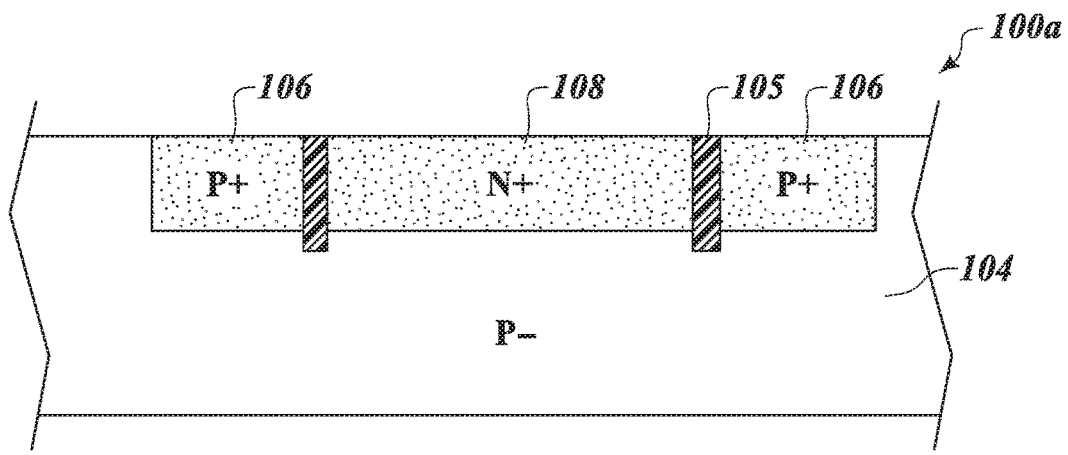
FIG. 3C is an alternative embodiment of the structure of FIG. 3B.

FIG. 3C illustrates an alternative embodiment in which a shallow trench isolation (STI) 105 is positioned between the cathode 108 and the anode 106. The STI 105 can be made of any acceptable insulating material; for example, silicon dioxide, silicon nitride, or other material as is commonly used for STI, such layers being well known in the art.

In the embodiment of FIG. 3C, the diode becomes conducting when the voltage difference between the anode 106 and the cathode 108 is sufficient for current to flow around the bottom of the STI 105, through the substrate 104, and into the cathode 108. Thus, the current lines extend in an arc from the anode 106 through the substrate 104 and into the cathode 108 in order to dissipate power in the diode when it becomes conducting. The threshold voltage to turn on the diode of the embodiment shown in FIG. 3C can be selected based on the depth of the STI 105, the width of the STI 105 to space the anode 106 and cathode 108 apart from each other, as well as the doping profiles of each of the anode, cathode, and substrate 104.

Figure 3D:
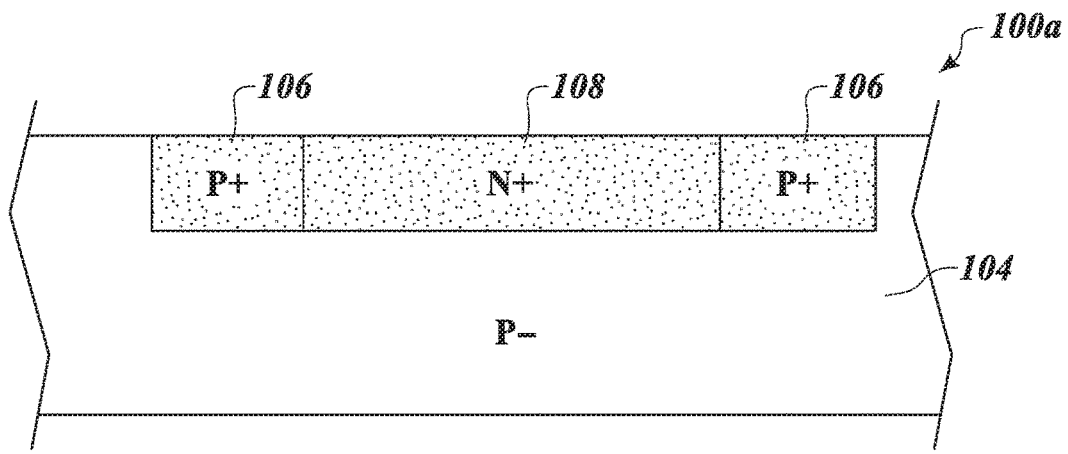
FIG. 3D is an alternative embodiment of the diode structure of FIG. 3B.

FIG. 3D illustrates a further alternative embodiment for the diode 100a. In this embodiment, the unsilicide P+ anode 106 directly abuts against the unsilicide N+ cathode 108. In this embodiment, unsilicide anode and cathode are used otherwise the silicide metal at the junction will short the two semiconductor and diode action will be lost. When the voltage difference on the anode 106 and the cathode 108 exceeds the threshold voltage for the junction between the two, the diode will conduct and turn on. As can be appreciated, when the P-type and N-type doping regions contact each other, the turn-on characteristics of the diode are substantially different, and typically at a lower voltage level and lower turn-on resistance than when they are spaced apart from each other in the embodiments shown in FIG. 3B and FIG. 3C. The user of the diodes will custom-select the diode threshold and the turn-on characteristics desired for the particular circuit in which the inventive diode is used.

In the remaining figures, FIG. 4A-13F, the type of diode used in the examples is that shown in FIG. 3B. However, according to principles of the disclosure, the type of diode used can be the type shown in FIG. 3C, 3D, or other type of acceptable diode. Thus, for ease of illustration, and to reduce the number of figures, only the example of the type of diode in FIG. 3B is shown in the remaining figures. However, either of the embodiments of FIG. 3C or FIG. 3D can be substituted and used as the diode in any of the other figures and embodiments of the present disclosure.

As can be appreciated, the diode bank 100 can be any number of diodes. In a simple embodiment, it is a single diode 100a, and this single diode is used for the protection of the circuit as described herein. Alternatively, the diode bank 100 can be five diodes, as shown, or can be dozens or hundreds of diodes all coupled together, labeled 100a-100n in the figures herein.

Figure 4A:
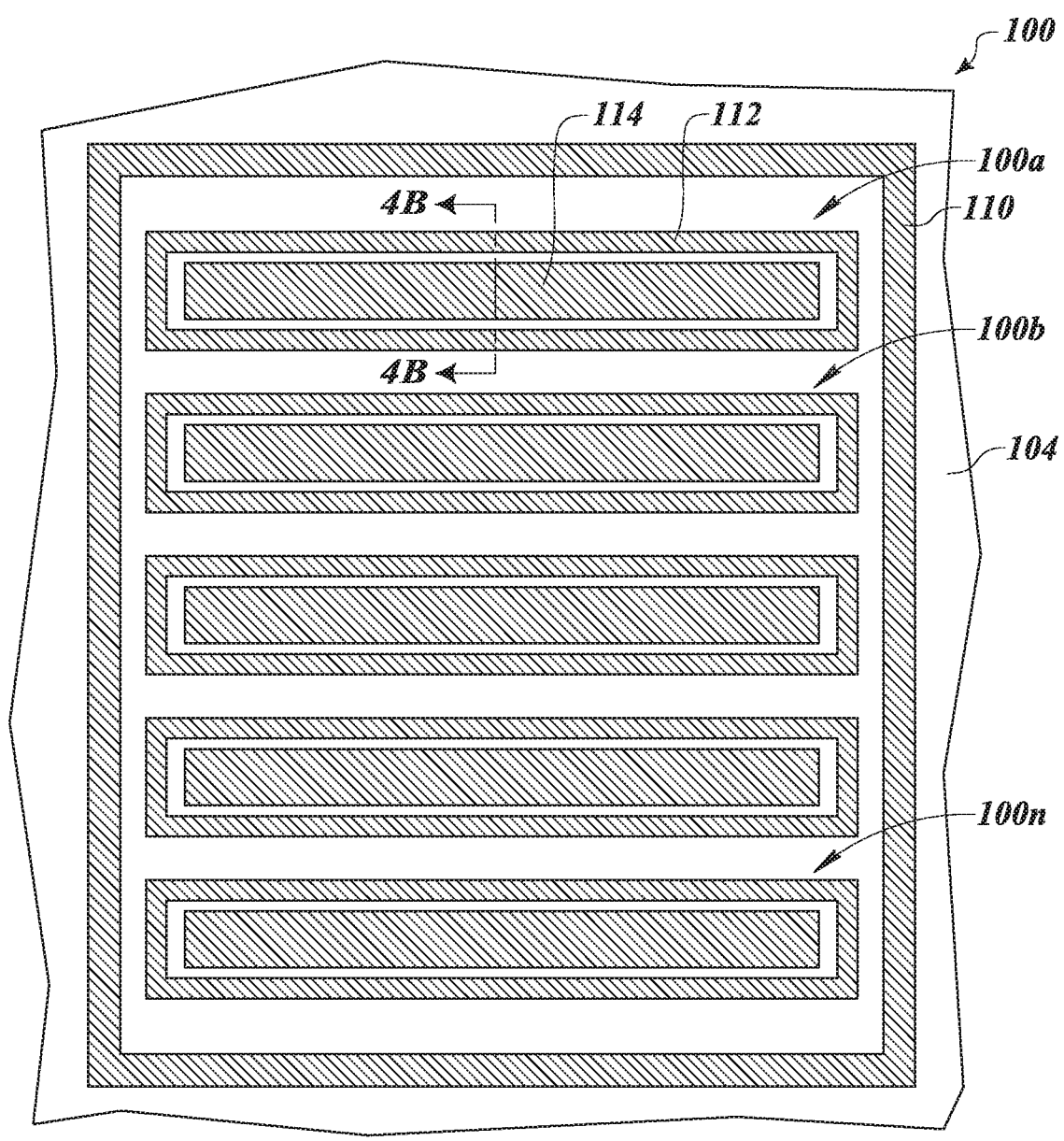
FIG. 4A is a top plan view with an additional metal layer on top of FIG. 3A.
Figure 4B:
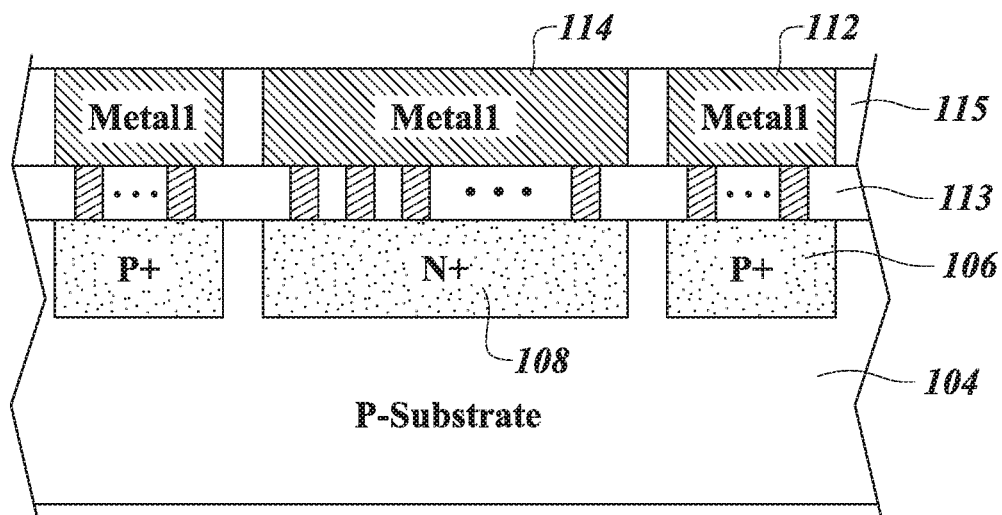
FIG. 4B is a cross-sectional view taken along line 4B-4B of FIG. 4A according to one embodiment.

FIGS. 4A and 4B illustrate the diode bank 100 after a first metal layer has been deposited. An anode electrode 112 is provided directly overlying in an electrical contact with the anode 106. A cathode electrode 114 is provided directly overlying and in electrical connection with the cathode 108. In some embodiments, the electrodes 112 and 114 might be directly on top of the semiconductor substrate 104, and physical contact with the respective anodes and cathodes is possible. The electrode can include a silicide on top of the respective anode and cathode regions 106 and 108 in the semiconductor substrate 104. In addition, in some embodiments, the electrode can be a metal layer directly on top of a metal silicide layer in both direct physical contact and electrical contact with the respective anode and cathode.

In a preferred embodiment, as shown in FIG. 4B, an insulation layer 113 is positioned between the anode 106 and the anode electrode 112 and the cathode 108 and the cathode electrode 114. An insulation layer 115 is positioned in the same level as the anode electrode and the cathode electrode to electrically insulate them from each other.

One use of the diode bank 100 is for a high noise protection in the semiconductor circuit which has high frequency signals thereon. It may also serve as a protection diode for an ESD event, power surges, voltage spikes, noise, or other voltage or noise that may occur on the semiconductor substrate 104. In particular, the semiconductor substrate 104 will include circuits which need protection from unexpected voltage or current spikes, or high noise events. For example, the substrate 104 may include a CPU, multiple processor cores, a large memory, a video processing circuit or many other circuits. In a preferred embodiment, the substrate 104 is a high speed processing circuit which may be used for mobile cellular communications, such as 4G or 5G, which outputs an RF signal in the gigahertz band. Accordingly, voltage spikes, noise, ESD events or other perturbations may be occurring at very high speeds, such as in the gigahertz or terahertz speed. Accordingly, a protection diode which must discharge all such high noise and must have a very rapid reaction speeds. If the capacitance of the diode bank 100 is high, this will substantially slow the reaction speed to a high noise event.

High noise events can be caused by a number of factors. These high noise events might include electrostatic discharge (ESD), voltage spikes, current spikes, alpha particle hits, beta particle hits, power supply surges, both negative and positive, sudden load changes, exposure to a high frequency signal that is high in power and/or current, such as might occur closely adjacent to a cell tower, a microwave tower, a power surge in a transmitter, whether NFC, Bluetooth, cellular frequency or other. All of these electrical circuit disturbances are referred generically herein as high noise events. One of the goals of the diode bank 100 is to protect all the circuits connected to its corresponding pin on the semiconductor substrate 104 from these high noise events. Therefore, it must react very quickly to any changes in voltage or current, and it must be able to quickly dissipate the voltage and the current to a safe location, such as system ground, before it affects the operation or reliability of any of the other circuits on the substrate 104. Accordingly, it is desired to have the parasitic capacitance, which includes all unwanted capacitance, including the overlap and fringe capacitance, as low as possible.

FIG. 4B shows one embodiment of the disclosure in which the cathode electrode 114 is adjacent to the anode electrode 112 with the dielectric 115 between them.

Figure 4C:
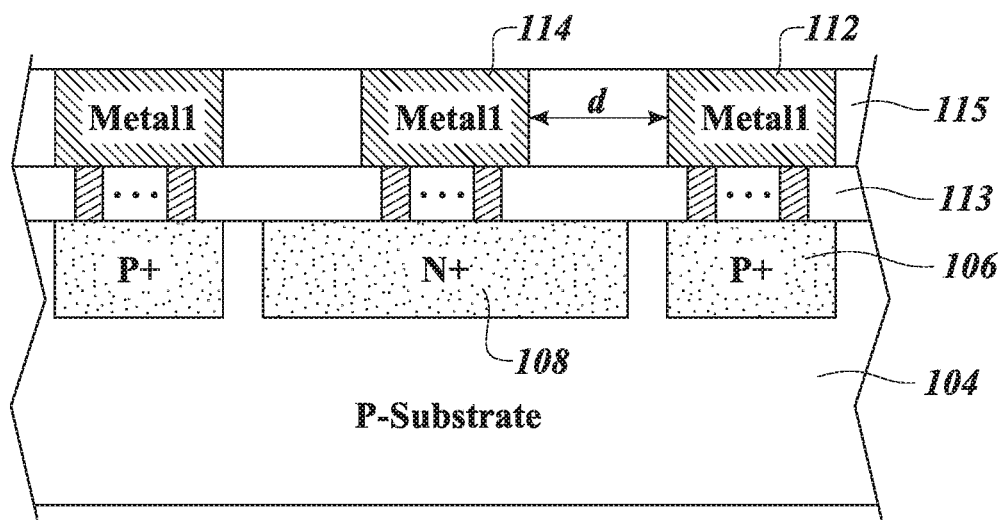
FIG. 4C is an alternative embodiment of the structure of FIG. 4B.

FIG. 4C represents another alternative embodiment. As can be appreciated, in FIG. 4B the facing surface area of the anode electrode 112 is identical to the facing surface area of the cathode electrode 114. According to one alternative embodiment, the overall capacitance can also be reduced by substantially increasing the distance d between the cathode and anode electrodes. In particular, as shown in FIG. 4C, the cathode electrode 114 is made to have approximately half the width, or even smaller, than the width of the prior embodiment of FIGS. 4A and 4B, and half the width of the cathode 108 itself. Thus, the distance d as shown in FIG. 4C is greater between the anode electrode 112 and the cathode electrode 114 for a full width cathode electrode. According to the capacitor equation, as the distance d becomes greater, the capacitance becomes less. The cathode electrode 114 is therefore made narrow, while still maintaining sufficient current carrying capability to perform the functions of the diode bank 100. In this particular embodiment, the cathode 108 itself maintains its original width. The core diode function is carried out by the diode operation between the anode 106 and the cathode 108. This dimension remains unchanged and, during a high noise event the diode bank 100 will operate based on the anode to cathode distance, doping levels, threshold voltage and other features of the diode bank 100. In order for fast diode operation, the cathode 108 is as close as practical to the anode 106. Having the cathode and anode close to each other increases the response time and operation speed, as well as the current carrying capability at a given voltage based on the interaction between anode 106 and the cathode 108. However, according to principles of the disclosure as set forth herein, the metal electrode 114 has substantially more current carrying capability than the semiconductor cathode 108. Accordingly, the cathode electrode 114 can, in some embodiments be made more narrow, and still have sufficient current carrying capability to discharge all of the excess current that occurs at the noise event. Accordingly, in one embodiment, as shown in FIG. 4C, the cathode electrode 114 is made more narrow to increase the distance d and therefore substantially reduce the fringe capacitance at the cathode and anode electrical interaction level.

FIGS. 5A-5E illustrate the diode bank 100 with subsequent layers deposited. As can be seen looking jointly at FIGS. 5A-5E, a subsequent insulation layer 116 has been deposited over metal 1 and insulation layer 115. In one embodiment, the insulation layers 115 and 116 are planarizing layers, which planarizes to the top of metal 1.

Figure 5A:
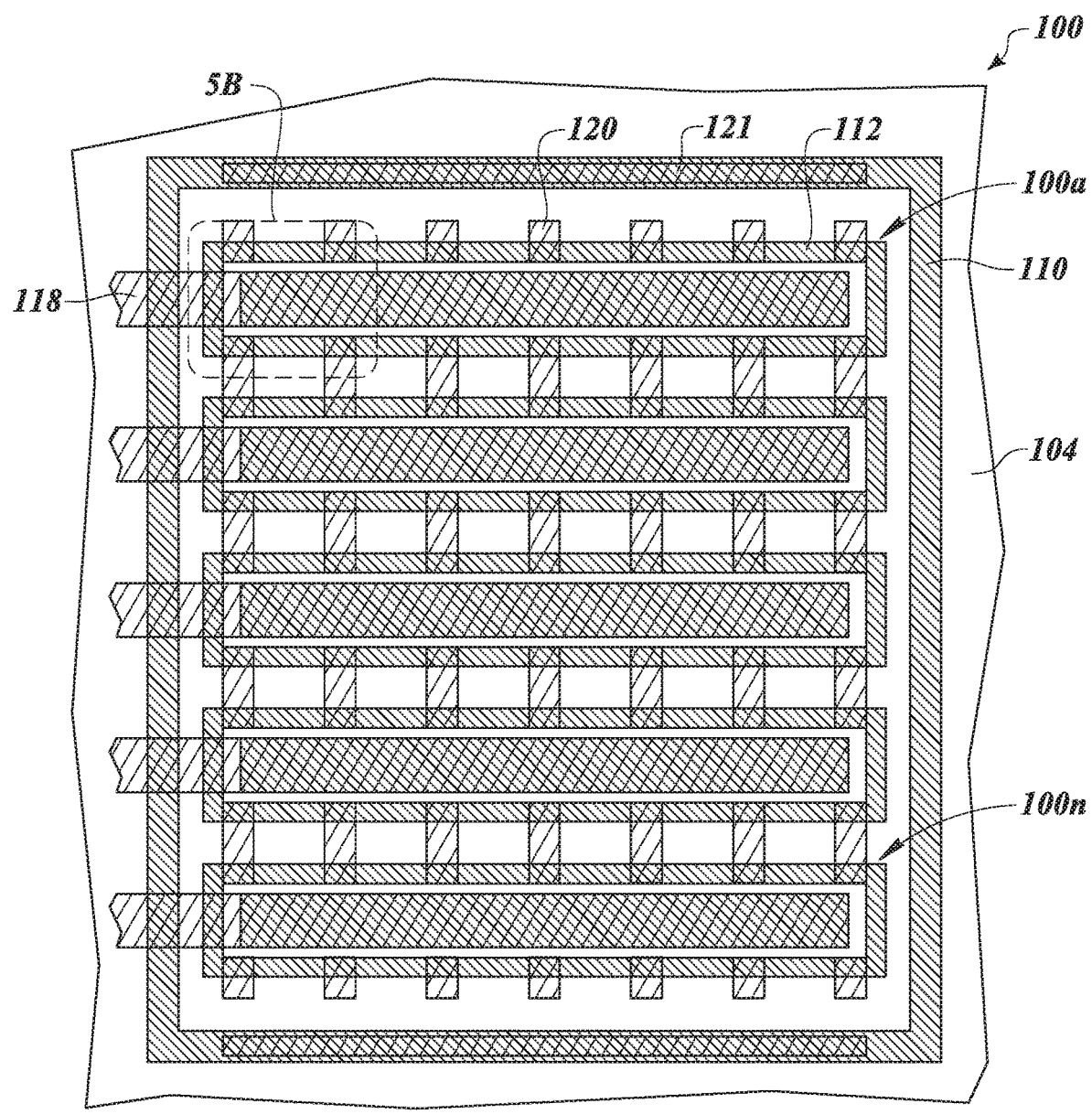
FIG. 5A is a top plan view of the structure shown in FIG. 4A with an additional metal layer.
Figure 5B:
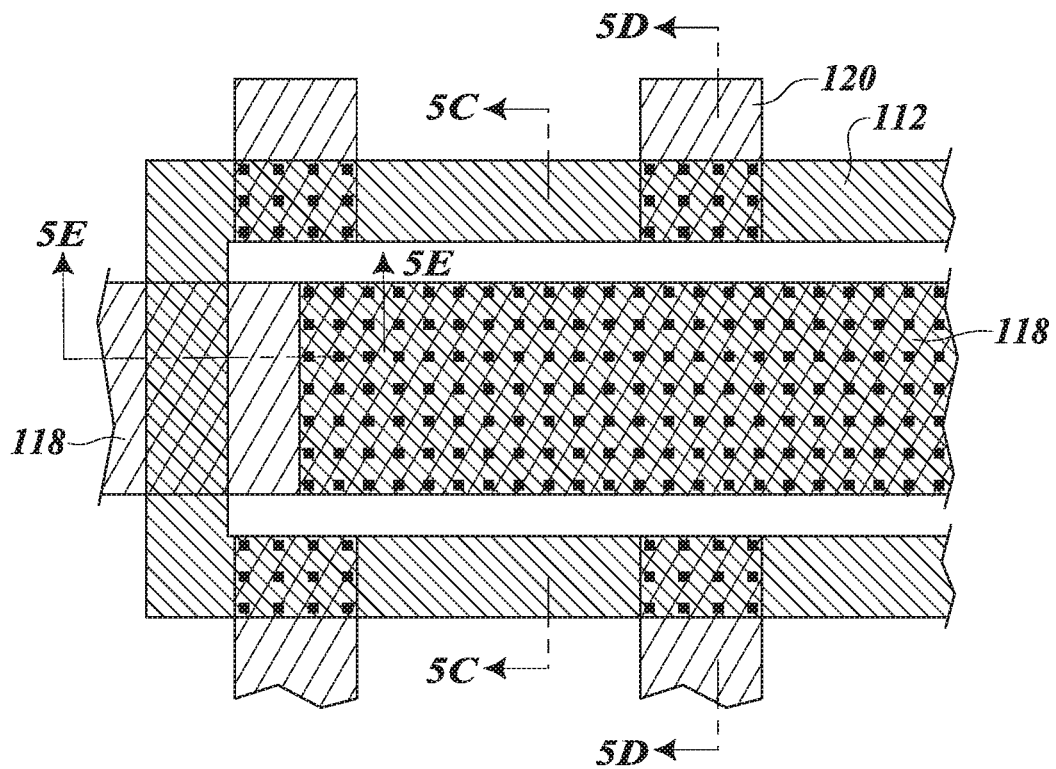
FIG. 5B is an enlarged view of the area marked 5B from FIG. 5A.
Figure 5C:
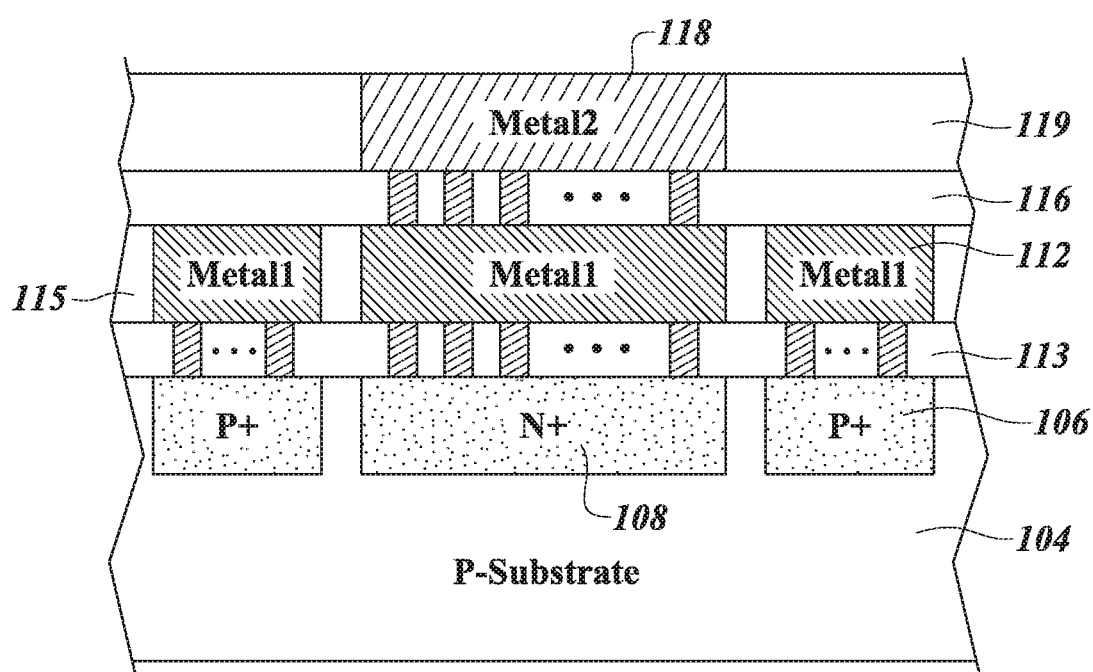
FIG. 5C is a cross-sectional view taken along line 5C-5C of FIG. 5B.
Figure 5D:
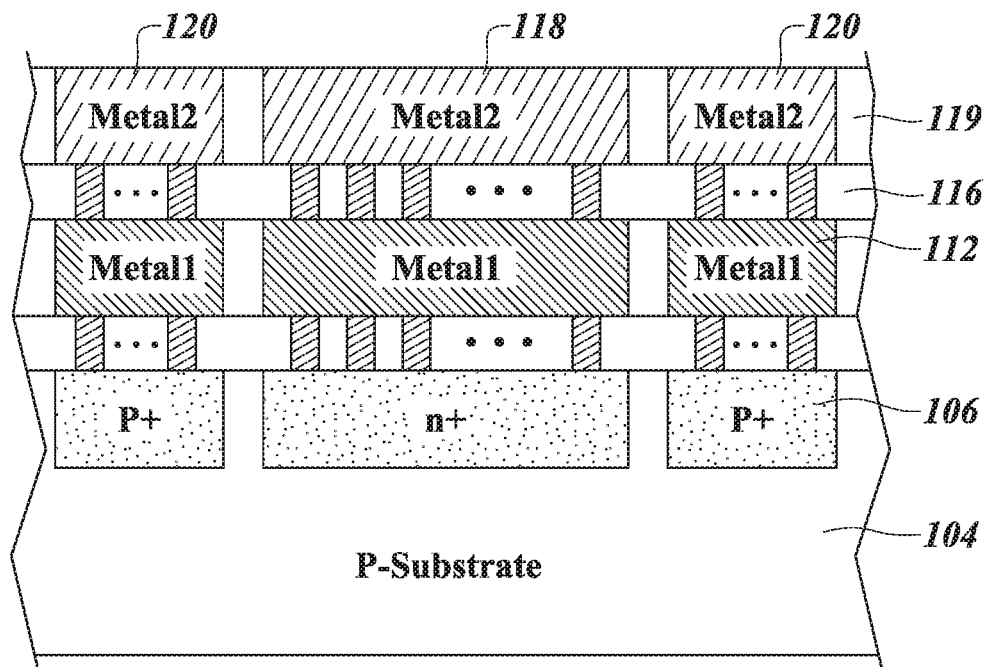
FIG. 5D is a cross-sectional view taken along line 5D-5D from FIG. 5B.

FIGS. 5A-5E illustrate one embodiment to substantially reduce the overlap parasitic capacitance as illustrated in FIGS. 1A and 1B. In particular, as can be seen in FIGS. 5A-5B, the electrical connection between the anode electrode 112 and metal 2 is made as a small area via metal 120. In particular, as best seen in FIGS. 5B and 5C, the electrical connections made between metal 2 segments 120 are in a plurality of relatively small area segments and they do not extend along the entire length of the anode electrode 112. Instead, in the embodiment shown there are seven different small area locations in which the electrical connection for the via metal 120 is present between metal 2 and the anode electrode of 112 of metal 1. Preferably, the via metal 120 has a selected width as can be seen in FIG. 5D. This selected width provides electrical connection to the anode electrode 112 of sufficient area to carry the current of a noise event, but is a substantially reduced width, and therefore a reduced parallel run length between anode and cathode which keeps the fringe capacitance at a lower value than a larger run length for the conductor metal that overlies the via to metal 1 segment 120. In particular, each of the metal segments 120 has a selected width and each of the metal segments 120 are spaced from every other metal segment a selected distance Namely, as can be best seen in FIG. 5B, The width of each via 120, in combination with the distance between them is selected to ensure adequate current flow to dissipate any extra power that may be present in a noise event.

FIG. 5C is a cross section taken along lines 5C-5C of FIG. 5B. As can be seen, metal 2 is directly over metal 1 for the cathode 118. Since both of these metals are at the same electrical value, no capacitance is formed between them. The anode electrode has no connection at this region, as can be seen by the insulation layer 119. FIG. 5D is a cross section through lines 5D-5D from FIG. 5B and as can be seen, at this location there is a metal segment 120 that provides electrical connection to the anode electrode 112. As can be appreciated, at those locations where the cathode connection 118 and the anode connection 120 are adjacent to each other, there will be a fringe capacitance. However, by making the selected width of metal 120 small compared to the space between the metal segment 120, this fringe capacitance can be reduced to a small value, and therefore the overall capacitance of the diode bank 100 can be substantially reduced.

Figure 5E:
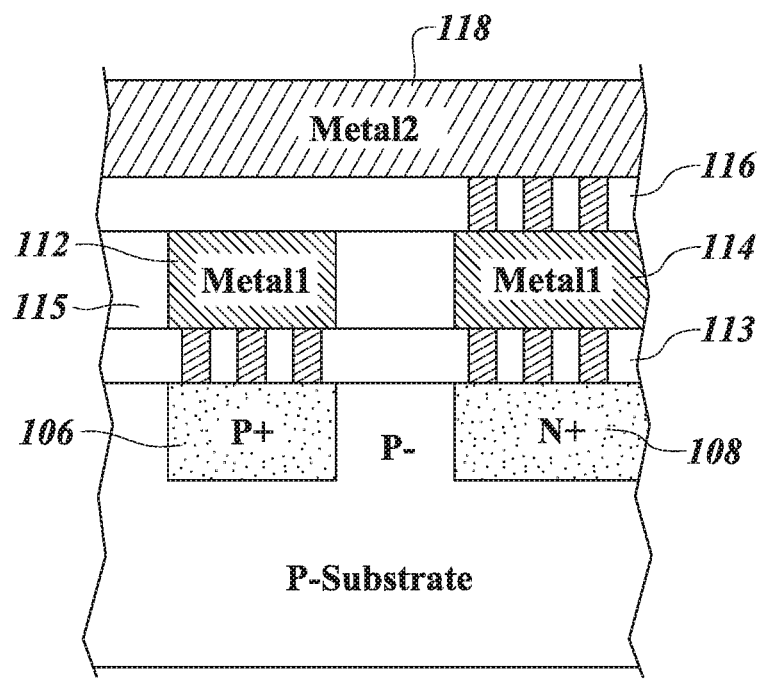
FIG. 5E is a cross-sectional view taken along dashed line 5E-5E of FIG. 5B.

FIG. 5E is a cross sectional view taken along line 5E-5E of 5B. As can be seen, at this location cathode connection 118 of metal 2 passes over the anode 112 comprised of metal 1. At this location, there will be a small amount of overlap parasitic capacitance of the type shown in FIGS. 1A and 1B. However, the area of the overlap is quite small. As can be seen in FIG. 5B, the area of the overlap is limited to the width of the cathode electrode 118. This is a relatively small overlap parasitic capacitance, as compared to what might be present if 118 were directly over 112 for a larger area. Accordingly, the overlap parasitic capacitance substantially reduced by the construction as shown in FIGS. 5B and 5E.

In particular, in the diode design according to the principles of the present embodiment, the overlap between adjacent metal layers occurs only when the layers are running perpendicular to each other. As can be seen by viewing FIG. 5A, the metal 2 layer 118 extends perpendicular to the anode electrode 112 at the location where they cross. Thus, instead of the two metal lines M1 and M2 running parallel to each other and having an extended overlap length that increases the area of interaction of the two plates of the capacitor, in the embodiment of FIGS. 5A-5E the metal 1 segment 112 extends in a first direction, and the metal 2 layer 118 extends perpendicular to this first direction. Accordingly, the overlap area of the plates of the capacitor is limited to the width of the metal rather than the extended length of the metal run.

Figure 6A:
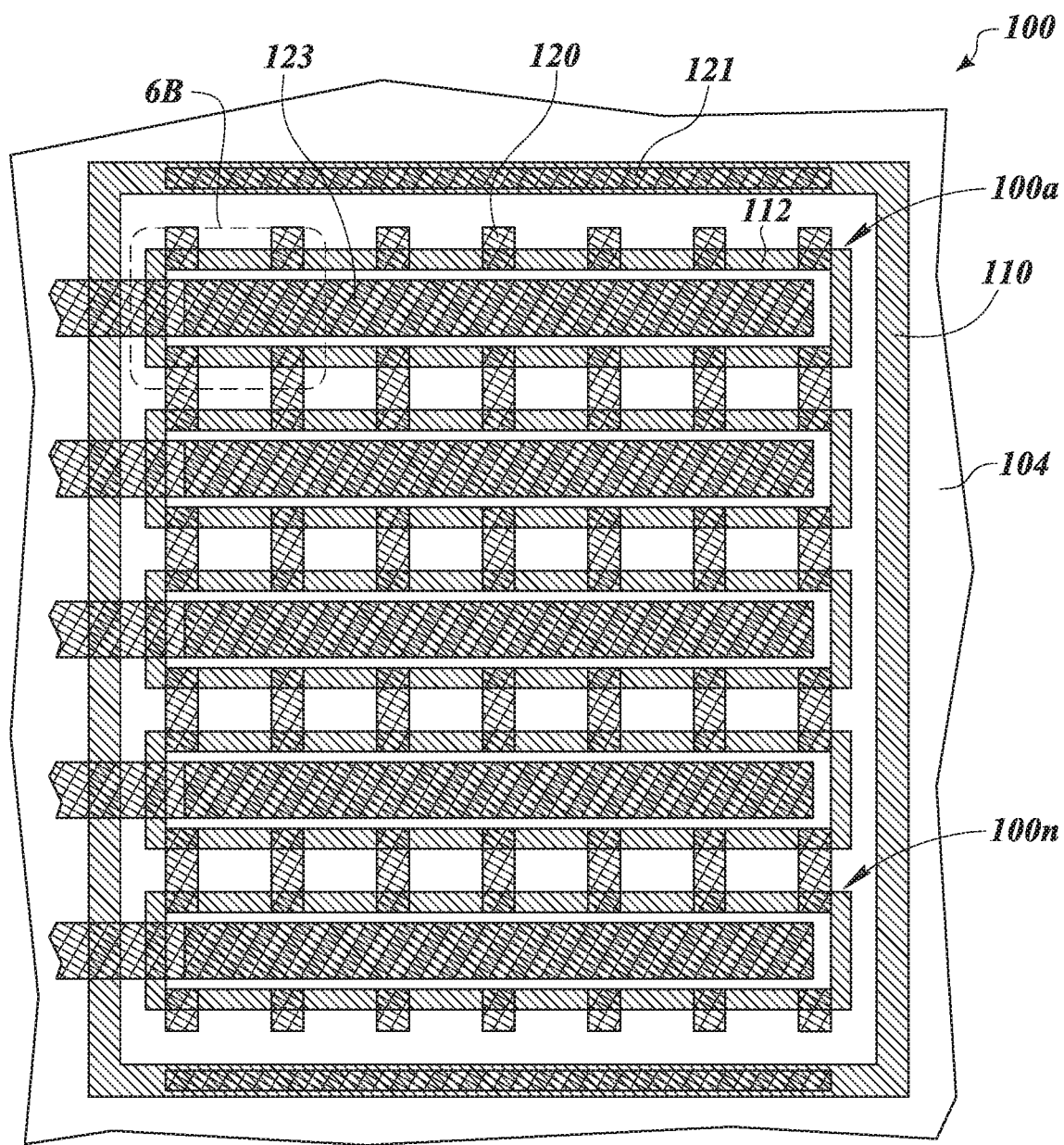
FIG. 6A is a top plan view of the structure of FIG. 5A with an additional metal layer.
Figure 6B:
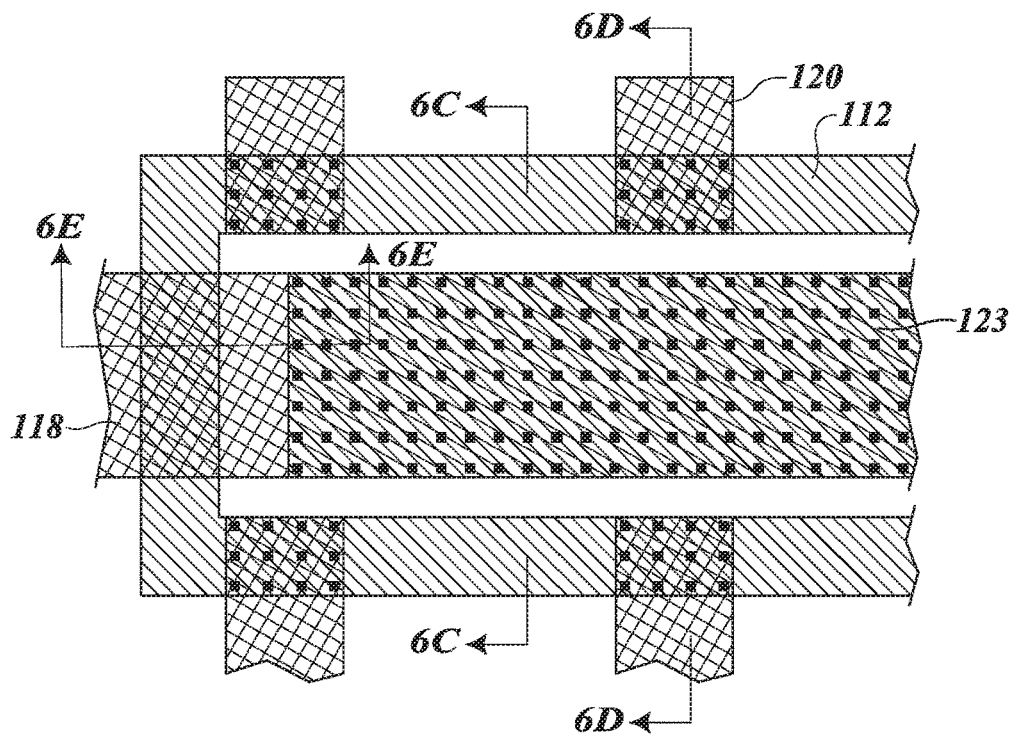
FIG. 6B is an enlarged view of section 6B from FIG. 6A.
Figure 6C:
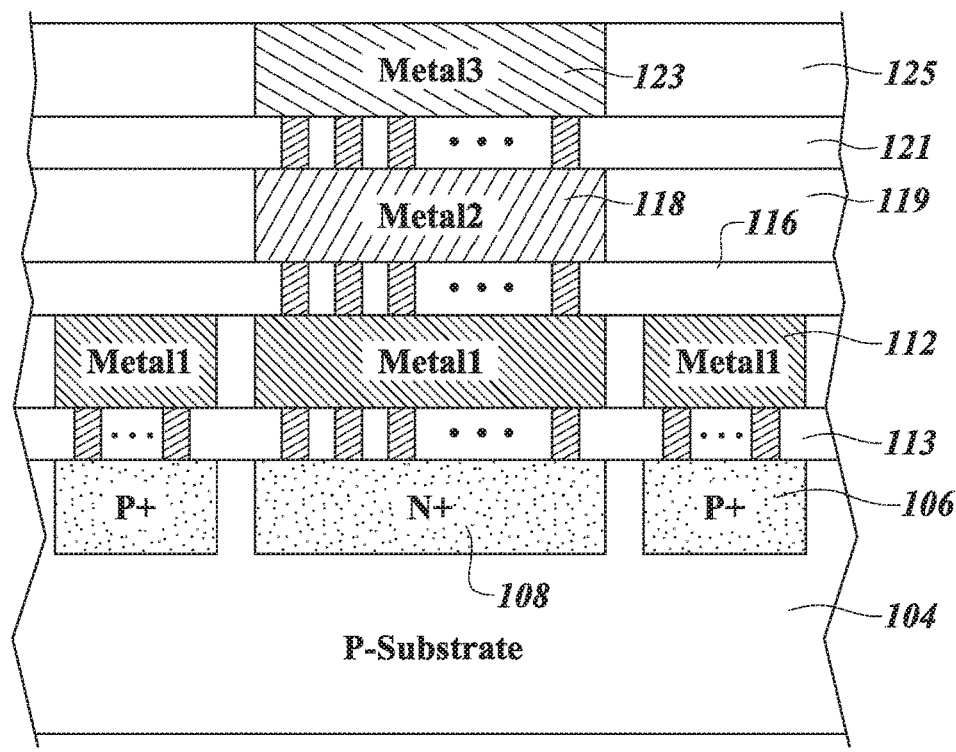
FIG. 6C is a cross-sectional view taken along line 6C-6C from FIG. 6B.

FIGS. 6A-6C illustrate the capacitor bank 100, with an additional set of insulation and metal layers. In particular, insulation layer 121 is deposited on top of metal 2 and insulation layer 119, and subsequently metal 3 with the appropriate via connections made to metal 2 are deposited over insulation layer 121, and insulation layer 125 is deposited adjacent to metal 3.

As can be best seen viewing FIG. 6B, metal 3 is deposited directly overlying metal 2 at all locations with the appropriate vias made from metal 3 to metal 2. In particular, metal 3 member 123 that is over the cathode has the same width and length as cathode 108 and the metal member 127 that is over metal 1 strip 112 and metal 2 strip 120 has the same width and length as each of them to make electrical contact to metal 2 with many vias as shown in FIG. 6C.

As shown in FIG. 6C, the only metal layer over the anode 106 is the anode electrode 112, which corresponds to metal 1. All other layers are not present for a substantial area of the anode 106. Successive insulation layers 116, 119, 121, and 125 are above metal 1 in the region between the vias 120. Accordingly, the fringe capacitance in the location of FIG. 6C is zero.

Figure 6D:
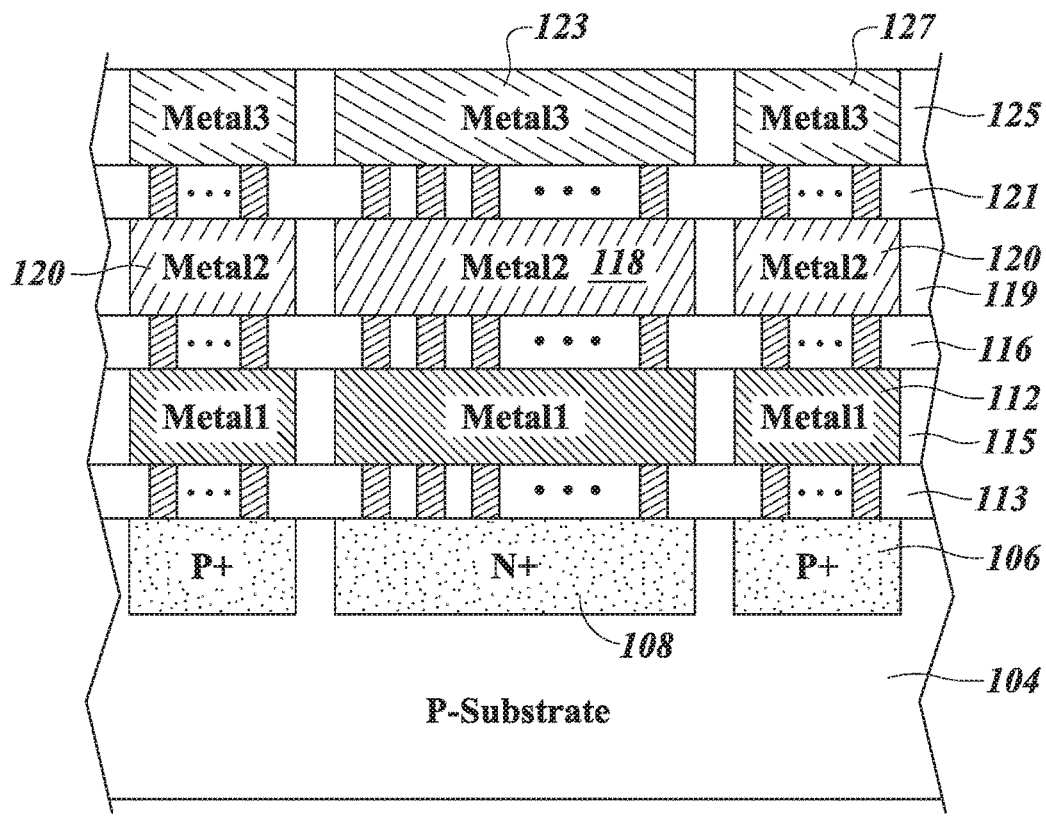
FIG. 6D is a cross-sectional view taken along line 6D-6D of FIG. 6B.

FIG. 6D is a cross section taken through the stacked via 120 of FIG. 6B. At this location, metal 3 is directly above metal 2, and provides the electrical connection to the anode 106. Accordingly, there will be some fringe capacitance between the cathode contact 123 of metal 3 and the anode contact 127 of metal 3; however, because of the reduced width of the metal segment 120 as shown in FIG. 6B, the fringe capacitance will be substantially reduced.

Figure 6E:
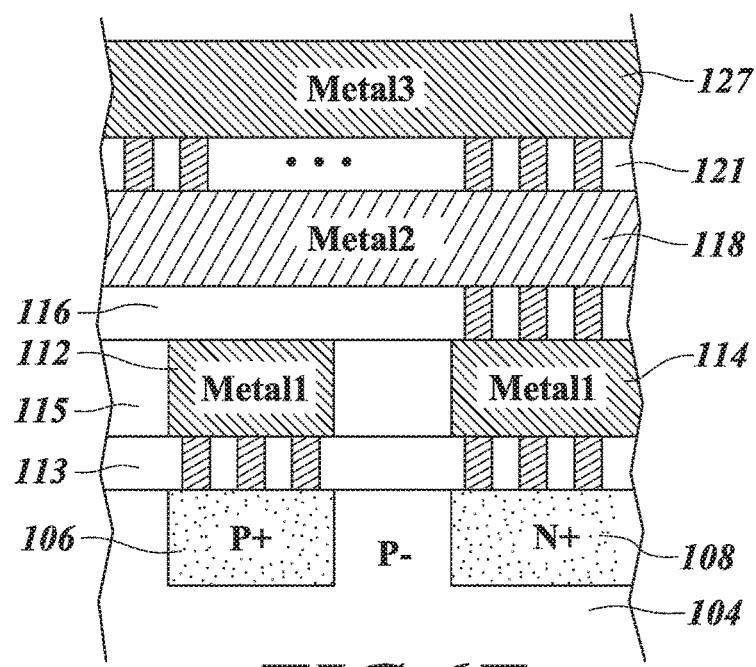
FIG. 6E is a cross-sectional view taken along dashed line 6E-6E of FIG. 6B.

FIG. 6E illustrates a cross section taken along lines 6C-6C of FIG. 6B. As can be seen, subsequent cathode metals 1, 2 and 3 are deposited exactly on the cathode itself, and do not overlap with the anode at the end 112. The overlapped capacitance is therefore not increased by the addition of metal 3 overlaying the cathode 108.

In one alternative embodiment, the cathode via layer 123 of metal 3 is exactly the same dimension and shape as the cathode via layer 118 when it is desired to provide additional capacity for carrying more power for a noise event. In particular, because cathode metals 118 to 123 will always be at the same voltage, having the stacked layers 118 and 123 directly on top of each other does not increase the capacitor for the circuit. Therefore, in one embodiment of FIGS. 6B and 6C, metal 3 runs over the cathode directly on top of metal 2 for the cathode for its entire length and width, as shown in FIG. 6E. Providing metal 3 in this location does not add appreciably to the overall capacitance, but does add significant ability to carry more current to discharge if there is a noise event, and therefore, in some embodiments, the metal 3 will overlay exactly on top of metal 2 and be identical in width and length for the entire cathode as well as the electrical connection extending beyond the diode itself.

Figure 7A:
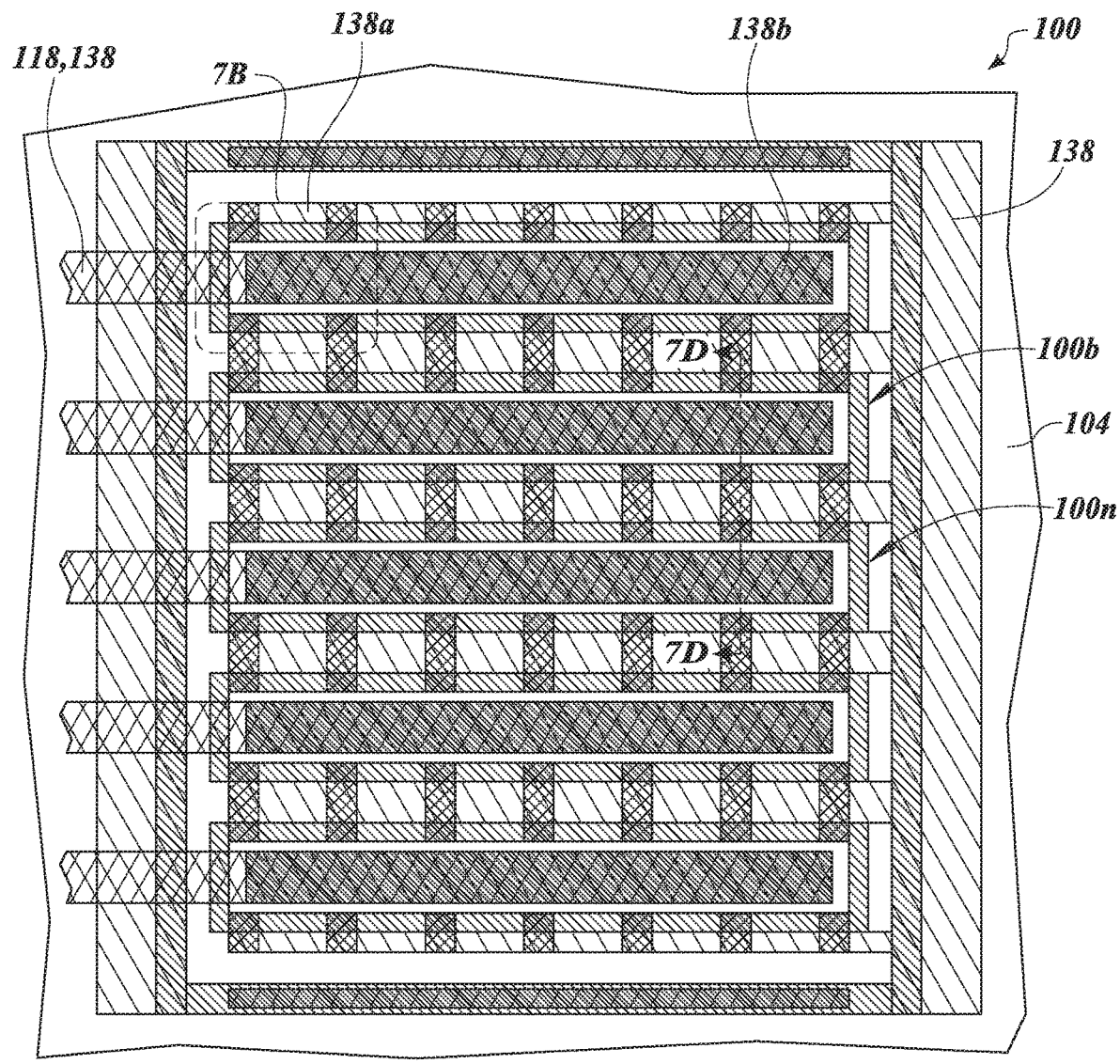
FIG. 7A is a top plan view of the structure of FIG. 6A with an additional two metal layers.
Figure 7B:
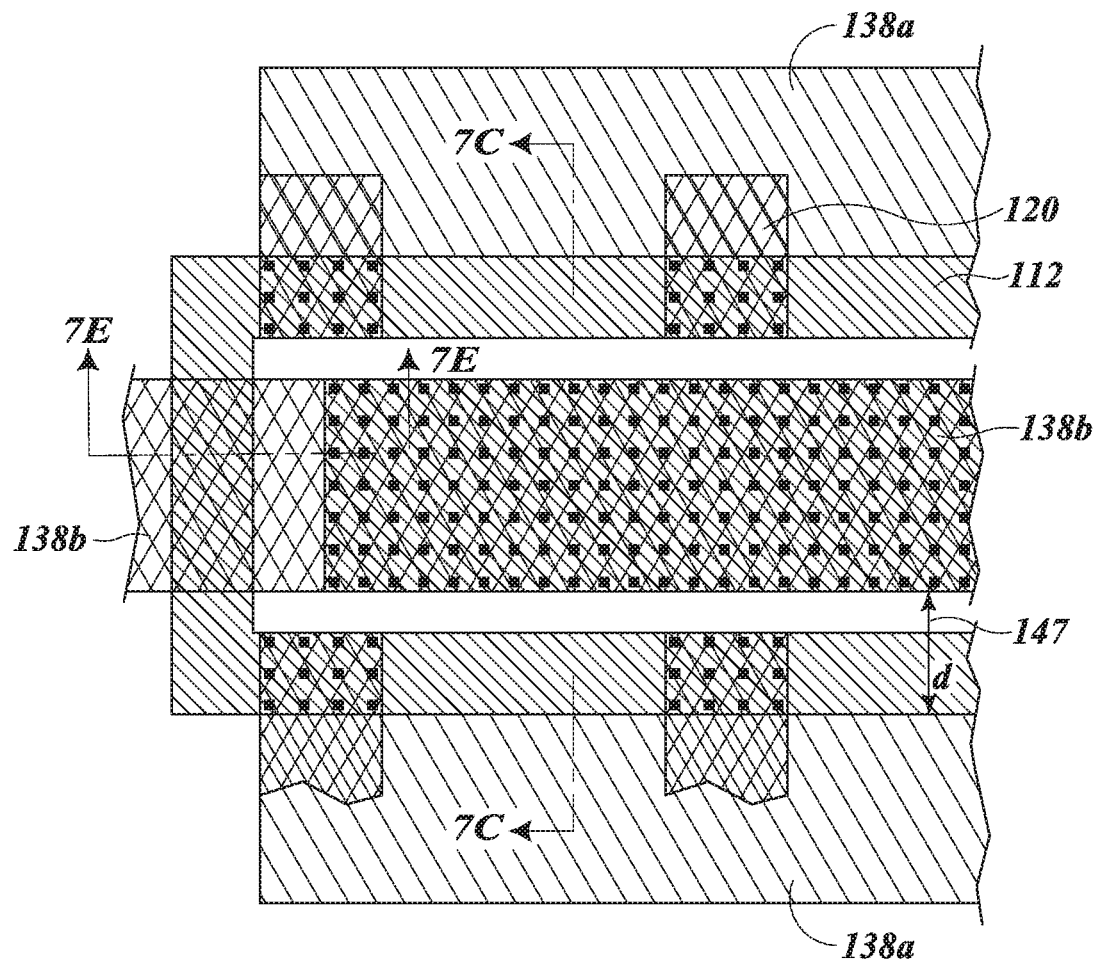
FIG. 7B is an enlarged view of the section shown as 7B from FIG. 7A.

FIGS. 7A-7E illustrate a number of subsequent insulation and metal interconnection layers being placed on the diode bank 100. In particular, as can best be seen in FIG. 7C, which is a cross section taken of FIG. 7B at the location 7C-7C, additional insulation layer 131 has been deposited over metal 3 and insulation layer 125 on top of which metal 4 and insulation layer 134 have been formed. Overlying metal 4 is insulation layer 136, on top of which is metal 5, layer 138. As can best be seen in FIG. 7A, layer 138, which is comprised of metal 5, has multiple fingers 138a and 138b which extend in alternate directions across the diode bank 100. As can be seen in FIG. 7B, a finger 138a of metal 5 extends between each of the individual diodes 100a to 100n. This finger 138a provides electrical connection of the anode 106 to the other parts of the circuit that form the noise protection circuit. In addition, metal 5 extends over the cathode as finger 138b, and provides electrical connection to the appropriate voltage source for the cathode 108.

Figure 7C:
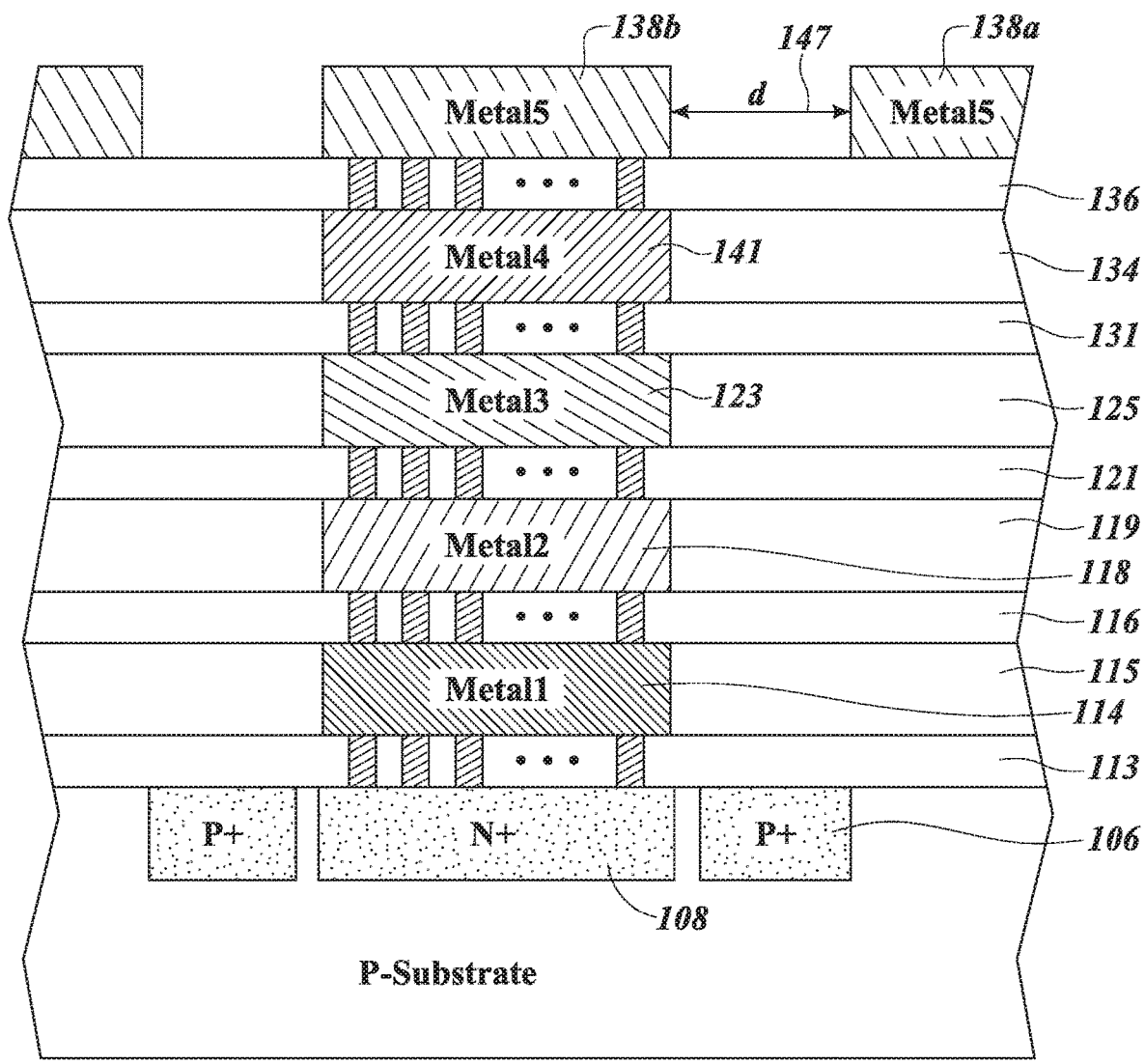
FIG. 7C is a cross-sectional view taken along line 7C-7C from FIG. 7B.

FIG. 7C, which is a cross section of FIG. 7B at the location 7C-7C, shows that the cathode connection 138b is the same size, and directly stacks on top of, all prior cathode connections. Since all cathode connections will be at the same voltage level, there is no increase in capacitance by stacking the metal layers exactly on top of each other. At the location in which the cross section of FIG. 7C is taken, the cathode 108 is electrically connected at all metal levels to the very top metal level, which in this embodiment is metal 5. As will be appreciated, there may be any number of metals in the diode bank 100. For example, there may be 7, 11, or even more metal layers in the diode bank 100. Alternatively, there may be fewer metal layers, such as only two metal layers.

As seen in FIG. 7C, there is a distance 147 between the anode finger 138a and the cathode finger 138b. This distance 147 is substantially greater than the distance between the cathode electrode 112 and the anode electrode 114. It is to be expected that at various times during the circuit operation, the anode finger 138a will be at a different voltage than the cathode finger 138b, and therefore there is potential that a capacitor will be formed between them based on the fringe capacitance. By making the metal 138a more narrow, the distance 147, as shown in FIG. 7C, is larger than at other locations, thus substantially reducing the fringe capacitance between the two adjacent metal layers 138a and 138b.

In particular, for metal 5, the fingers 138a and 138b run the same direction as each other, and therefore, the area of the capacitive plates that potentially interact with each other will be the height multiplied by the length of the run. At prior metal levels for M2, M3, and M4, a metal segment 120 was used to provide the connection to the anode electrode, and therefore there was only a small run length, and it was discontinuous over the length of the anode. With respect to metal 5, it is a continuous strip, as can be seen in FIGS. 7A and 7B. However, the effect of the fringe capacitance is reduced by increasing the distance d, as can be seen in FIGS. 7B and 7C.

Figure 7D:
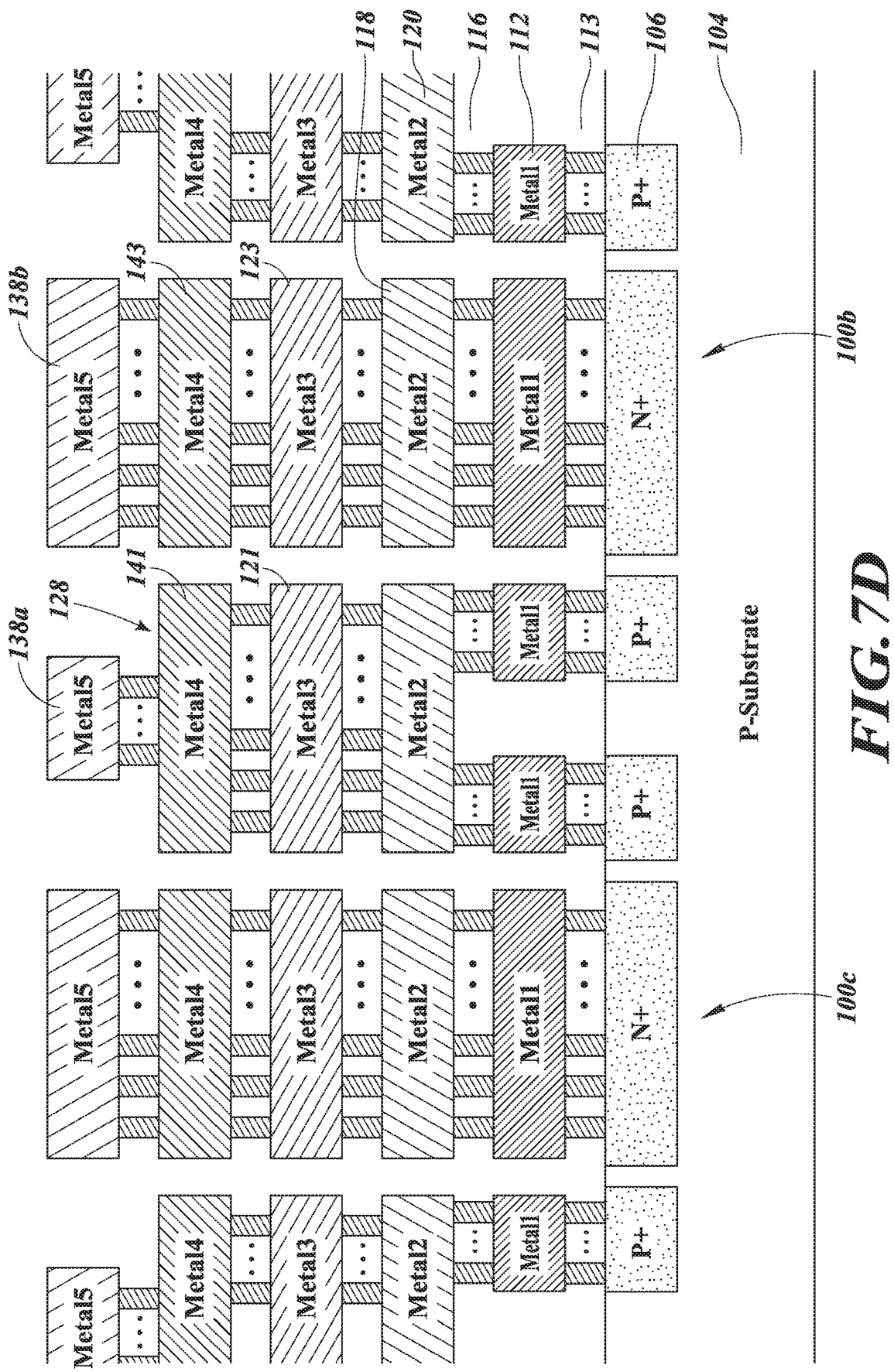
FIG. 7D is a cross-sectional view taken along line 7D-7D from FIG. 7A.
Figure 7E:
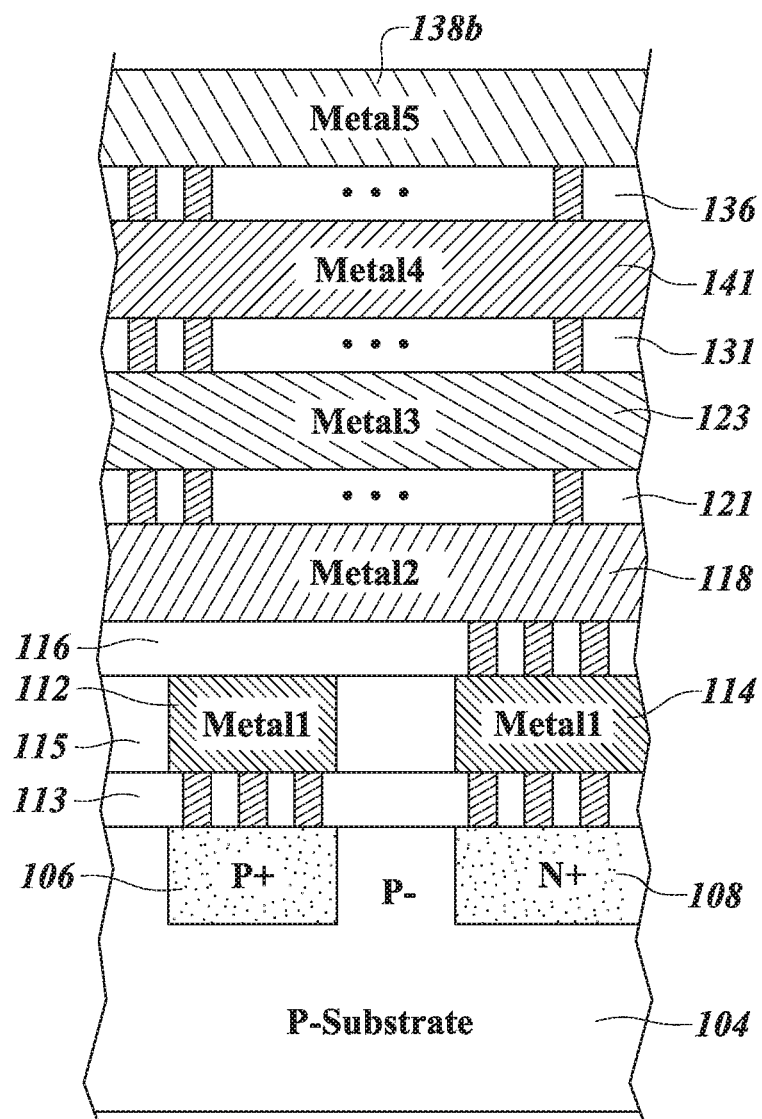
FIG. 7E is a cross-sectional view taken along line 7E-7E from FIG. 7B.

As shown in FIG. 7D, which is a cross section taken along line 7D-7D of FIG. 7A, the anode finger 138a has a via in the middle between two adjacent anode connections to adjacent diodes 100b and 100c. This anode finger 138a runs along the entire length of each diode 100a-100n, and therefore has the potential to contribute to the fringe capacitance. By selecting a distance d 147 between the anode finger 138a and the cathode finger 138b, the fringe capacitance is substantially reduced. This is achieved by making the anode finger 138a more narrow than the via bridges 128 that connect two metal segments 120 to each other to connect adjacent anodes to each other of adjacent diodes 100b-100c. In particular, each of the metal levels 2, 3, 4, etc., provide a bridge to electrically connect the anodes 106 of adjacent diodes 100a-100n in the bank 100 together in order to form a single large unitary diode. As shown in FIG. 7D, the fringe capacitance will be present at those locations where the anode bridge segment 128 is adjacent to the cathode 118, however, this is a relatively small area compared to the overall area of the anode and cathode, and therefore, the fringe capacitance will be reduced over what would otherwise be present.

FIG. 7D shows the diode connection that would be present between adjacent diodes 100b and 100c in the bank 100 of diodes. In particular, as can be seen, a diode 100b is directly adjacent to a diode 100c, which are two of the diodes in the bank 100 of diodes. These diodes have their anodes electrodes 112 connected to each other by bridge 128 by each metal layer which is present in the stack. A top anode connection 138a electrically connects at a central region of the bridge 128. Thus, the electrical connection between adjacent diodes 100b and 100c is made by the bridge anode connections 128 shown in FIGS. 7A and 7D, and this is present for all of the diodes in the entire bank 100, as shown in FIG. 7A.

As can be seen viewing FIGS. 7A-7D, many metals are stacked exactly on top of each other, thus providing a greater metal area than was possible in the prior art. However, as best illustrated in FIG. 7C with respect to the cathode 108, all of the metal layers stacked on top of each other have the same electrical voltage potential. Accordingly, the stack of metals M1-M5 has the capability to carry high power, yet there is no increase in capacitance because all of them are at the same voltage potential at all times. Similarly, as shown in FIG. 7D, the anode connections 120, 127, 141, and 138a are stacked vertically on top of the anode electrode 112, and thus provide high power and high current carrying capability to dissipate the power of a noise event. Extra area is obtained in the diode 100 by having parallel metal stacks on top of each other, but a very small width is used. The only capacitance which occurs within the diode bank 100 is fringe capacitance, which is a very small factor in capacitance since the thickness of each of the respective metals M1-M5 is relatively thin. The thickness, as illustrated by the height of each metal layer, is not to scale for that shown in the figures, since in most integrated circuits, the height of a metal layer will be less than half, and in many instances less than a quarter, of the height of insulation layers in-between. Accordingly, normally the insulation layers 116, 121, etc., will be twice as tall as the respective layers M2 and M3.

According to principles of the disclosure herein, a multi-finger diode 100 composing a bank of diodes is used instead of a large single-plate diode. Each single diode 100a-100n is physically separate, and each has the ability to carry current to be dissipated for a noise event. Each of the single diodes 100, 100n are connected in parallel to provide large current carrying capability to dissipate power.

Figure 9A:
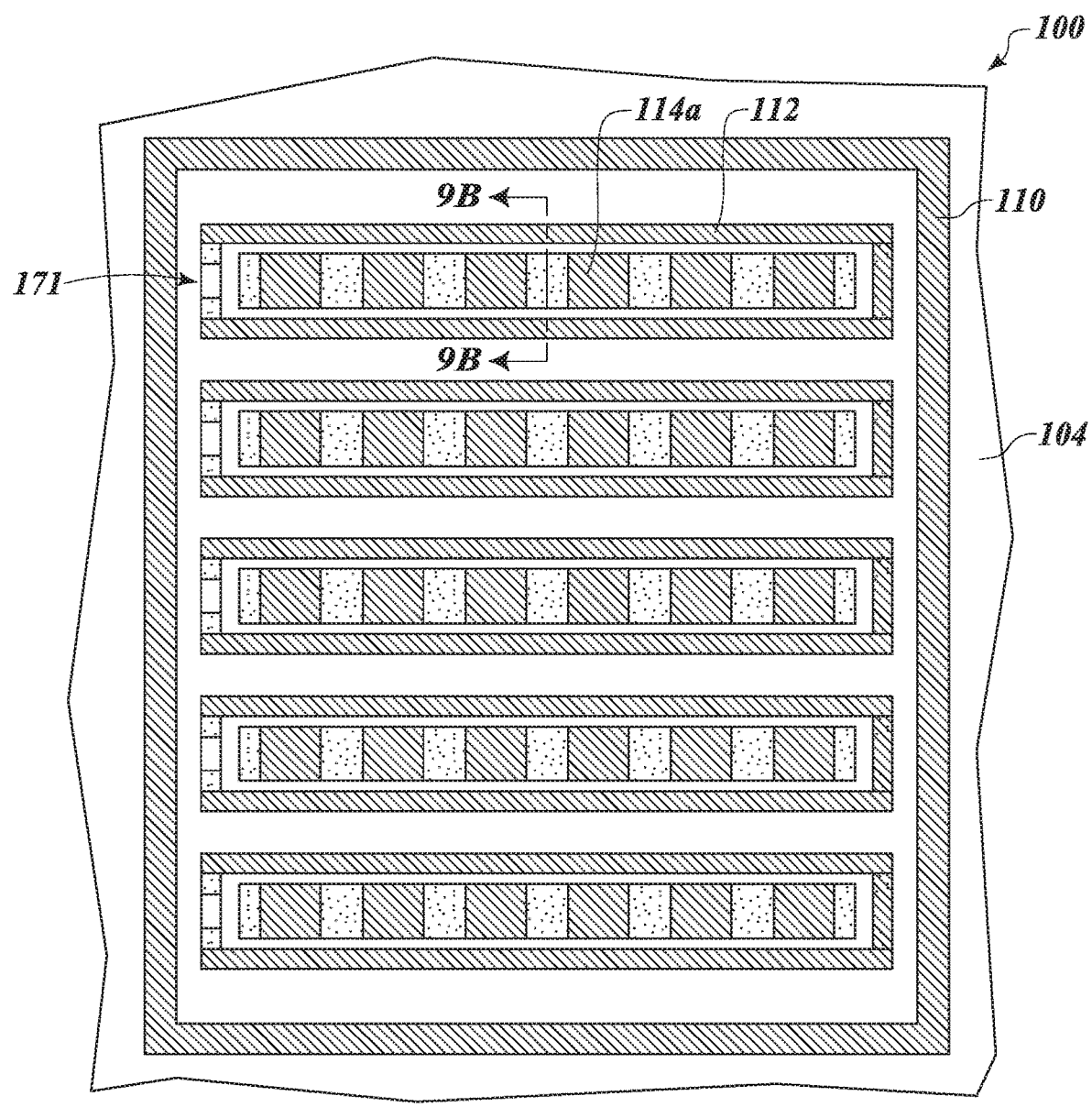
FIG. 9A is an alternative embodiment according to principles of the present disclosure.
Figure 12A:
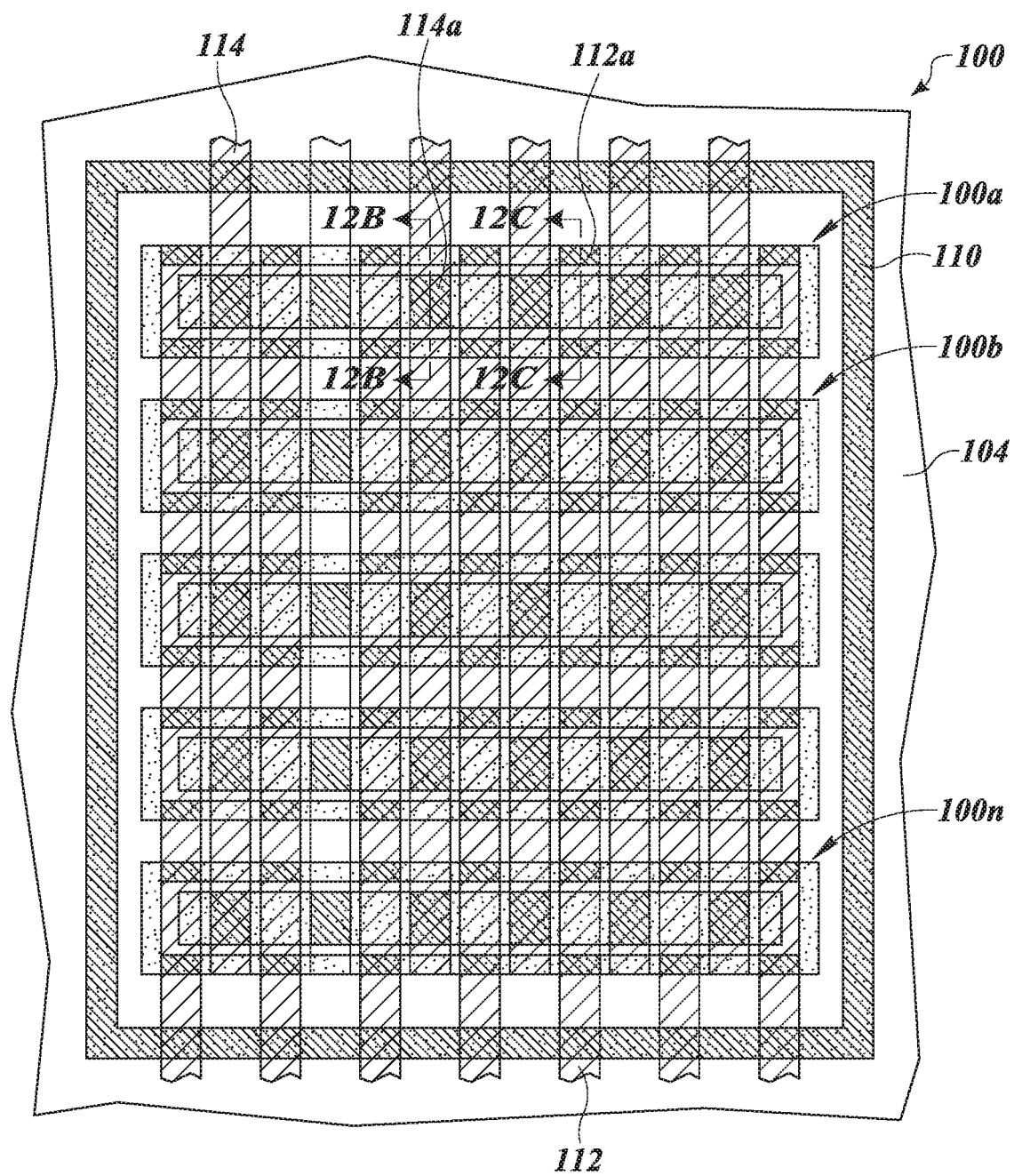
FIG. 12A is a top plan view of a further alternative embodiment according to principles of the present disclosure.
Figure 13A:
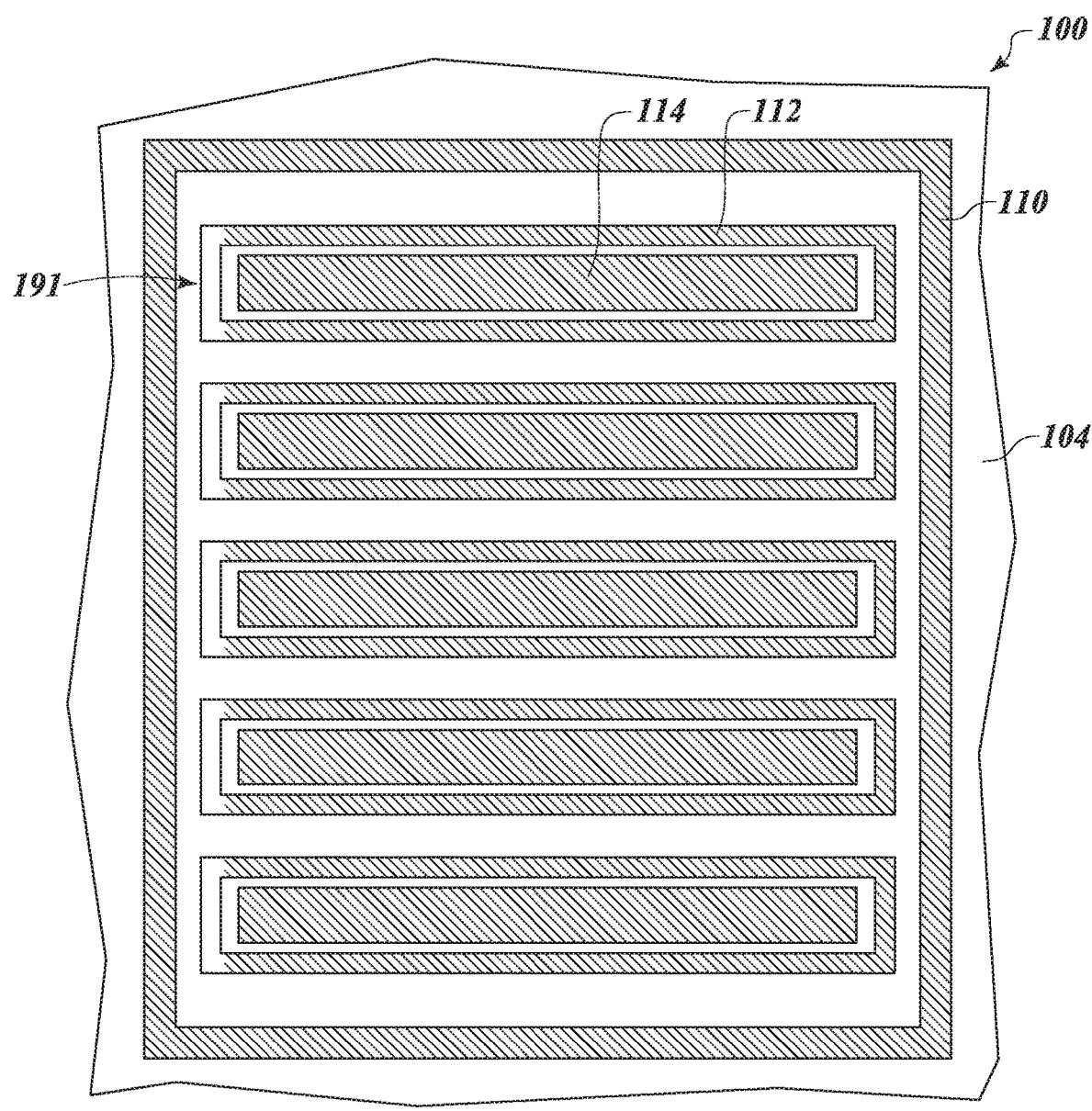
FIG. 13A is a top plan view of a further alternative embodiment according to principles of the present disclosure.

The segment 120 for the anode acts as a stitching to provide connection for the power while reducing further the fringe capacitance. Accordingly, the overlap capacitance is reduced to a very small value, namely that which is present when M2 overlaps M1 as shown in FIG. 5E. Thus, the small overlap of metal 2 of the cathode electrode metal 118 over the anode electrode 112 as shown in FIG. 5E is the only instance of overlap capacitance in the entire diode. Further, as illustrated in FIGS. 9A, 12A, and 13A, even this overlap capacitance can be removed with only a small reduction in power carrying capability by each diode. Accordingly, the overlap capacitance is not a major contributor to the parasitic capacitance in the diode according to the current disclosure.

As can be appreciated, there is a trade-off between a large metal area which has a large current carrying capability and reduction of capacitance. More metal can be used, which would increase the current carrying capability to remove excess power during a noise event; however, additional metal, depending on it location, may substantially increase the capacitance. The diode bank as explained herein has larger metal, but sharply reduces the overlap of the various metal layers to greatly reduce the parasitic capacitance.

A comparison between the diode according to the disclosure and the prior art illustrates the drastic savings in capacitance without a significant reduction in total diode area and total metal width.

TABLE 1

| Key Parameters of Diode Design | Prior Art Solution With 2 KV | Proposed Solution With 2 KV |
|---|---|---|
| Total diode area | 61.53 μm² | 59.8 μm² |
| Total metal width | 12.6 μm | 15.6 μm |
| Total capacitance | 339 femtofarads | 170 femtofarads |
| Device capacitance | 180 femtofarads | 146 femtofarads |
| Parasitic capacitance | 159 femtofarads | 24 femtofarads |

As can be seen in Table 1, the total capacitance of the device, including that of the diode, is approximately half the total capacitance of the prior art device. The parasitic capacitance is approximately 6.6 times less. In addition, as can be seen, there is no compromise on the ability to dissipate power for any noise event. Particularly, the total diode area is approximately the same; namely, the diode area of the proposed solution is within 97% of the diode area of the prior art. Further, the total metal width of 15.6μ is 23% larger than the metal area of the prior art. The present solution thus has the distinct advantage of drastically increasing the metal area while decreasing the overall device capacitance by half and the parasitic capacitance by over 6.6. Generally, as the metal width increases, the capacitance would increase accordingly, thus, one would expect that the current solution would have a capacitance value 23% larger than that of the prior art. However, based on the inventive solution disclosed herein, in which the only capacitance is a fringe capacitance except for the single overlap capacitance as disclosed, and even the fringe capacitance is drastically reduced by stitching a narrow via 120 at all locations. The parasitic capacitance is reduced by 6.6, while at the same time increasing the metal widths and the overall power and current carrying capability of the diode bank 100.

Figure 8:
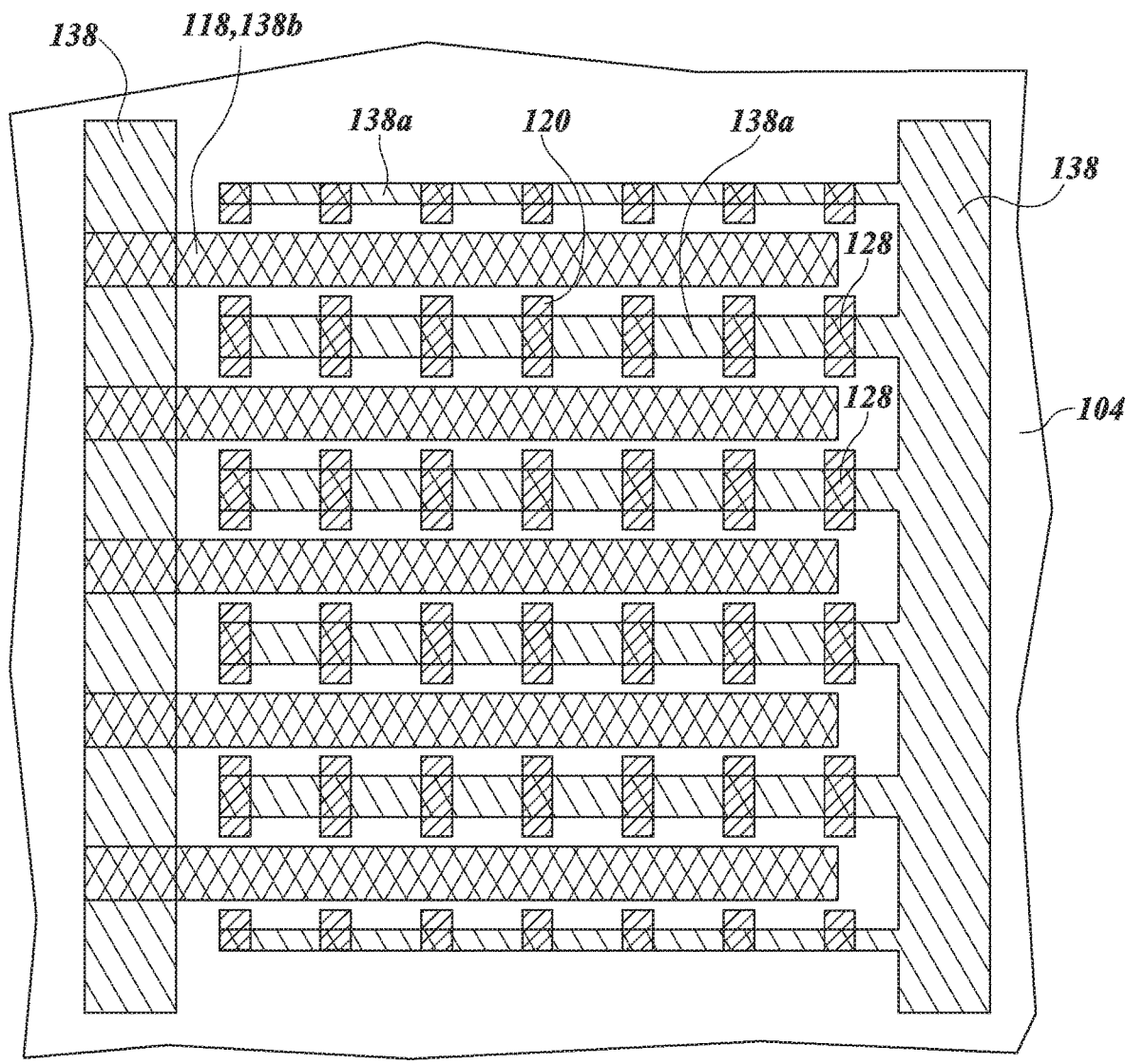
FIG. 8 is a top plan view of the structure from FIG. 7A but with only portions of three metal layers shown for ease in viewing.

FIG. 8 is top plan view showing parts of only three different metal layers for ease of understanding the entire structure. In particular, FIG. 8 shows metal layer 5, labeled 138, and metal layer 2, labeled 118. As can be seen, layer 138 provides the anode connection fingers 138a, which extend from the anode bank on the far right side. These anode fingers 138a extend over the bridge connections 128 to the respective metal segment 1 120, which connect to the anodes 106 of each of the diodes in the bank 100 of the diodes. For ease in understanding the figures, the active area of the diodes, as well as metal layers M1 and M3 are not shown, and only a small portion of metal layer M4 is shown. In particular, the metal layer M4 is shown to illustrate the connection of the anode fingers 138a to the bridge 128 between adjacent diodes. Thus the anode fingers 138a make electrical contact to the respective anodes via the anode bridges 128, fingers 138 make electrical contact to the respective anodes via the anode strips 141, 127, 120, and the anode electrode 112 as shown in FIGS. 7D and 8.

FIG. 8 also shows metal 5 138 provides the electrical connection to the cathode via finger 138b. In particular, finger 138*b* extends directly on top of and overlays the cathode stack of metal layers of 114, 118, 123, and 143. Thus, a high-power electrical connection permitting the passing of high current and high voltage is provided on top of the cathode, as illustrated in FIG. 8.

Figure 9B:
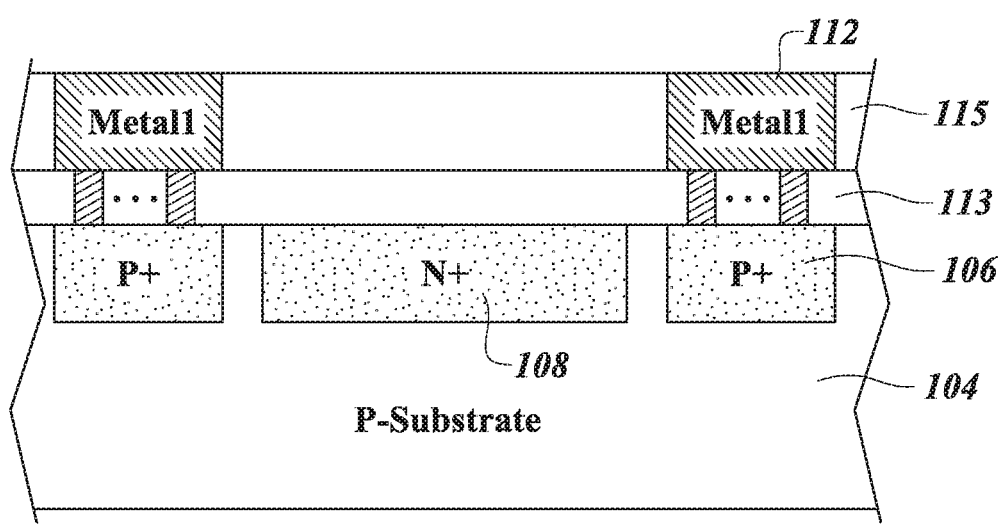
FIG. 9B is a cross-sectional view taken along line 9B-9B of FIG. 9A.

FIGS. 9A and 9B illustrate an alternative embodiment according to principles of the current disclosure. According to this alternative embodiment, the capacitance of the diode bank 100 is reduced by two changes in the metal 1 level. A first change is in the cathode electrode 114. In particular, the cathode electrode 114*a* is placed at only selected locations over the cathode 108. A cathode segment is a segment 114*a* positioned at selected locations over the cathode 108, as shown in FIGS. 9A and 9B. The cross section in FIG. 9B shows that the cathode segment 114*a* is not present at that location. Accordingly, there is no fringe capacitance between the cathode electrode segment 114*a* and the anode electrode 112, where the cathode electrode is missing. Another difference is that the anode electrode 112 does not completely surround the cathode 108 and does not completely overlap the anode 106. In particular, in the first embodiment, the anode electrode 112 is exactly the same area and exactly overlays the entire anode 106. In the embodiment of FIGS. 9A and 9B, the anode electrode 112 overlays all of the anode 106 except the open end 171 as shown in FIG. 9A. At the end 171 as shown in FIG. 9A, the anode electrode 112 is not present.

A selected metal pattern is used in which the anode electrode 112 is etched away at this location, together with the remaining portions of metal 1, to leave no anode electrode connection at end 171 for each of the diode 100*a*-100*n* in the diode bank 100. While this will have a minor decrease in the power that can be dissipated through the anode 106, it will reduce the overlap parasitic capacitance to zero. In particular, the end 171 represents less than 5% of the total area of the anode 106, and therefore will represent only a minor reduction in the power carrying capability of the anode electrode 112 from the anode 106 but it is 100% of the overlap parasitic capacitance.

Metal 2, metal 3, metal 4, and metal 5, using the same teachings, as shown in FIGS. 5A-7E, is overlaid on top of the structure of FIG. 9A. Because the end 171 is not present in the anode electrode 112, there is no capacitance added by metal 2 crossing over metal 1. Namely, there is no overlap of the parasitic capacitance between metal 2 and metal 1 at the end 171. In addition, as previously stated, the fringe capacitance between the cathode electrode 114*a* and the anode 112*a* is substantially reduced because the area of overlap between the two is substantially reduced.

Figure 10A:
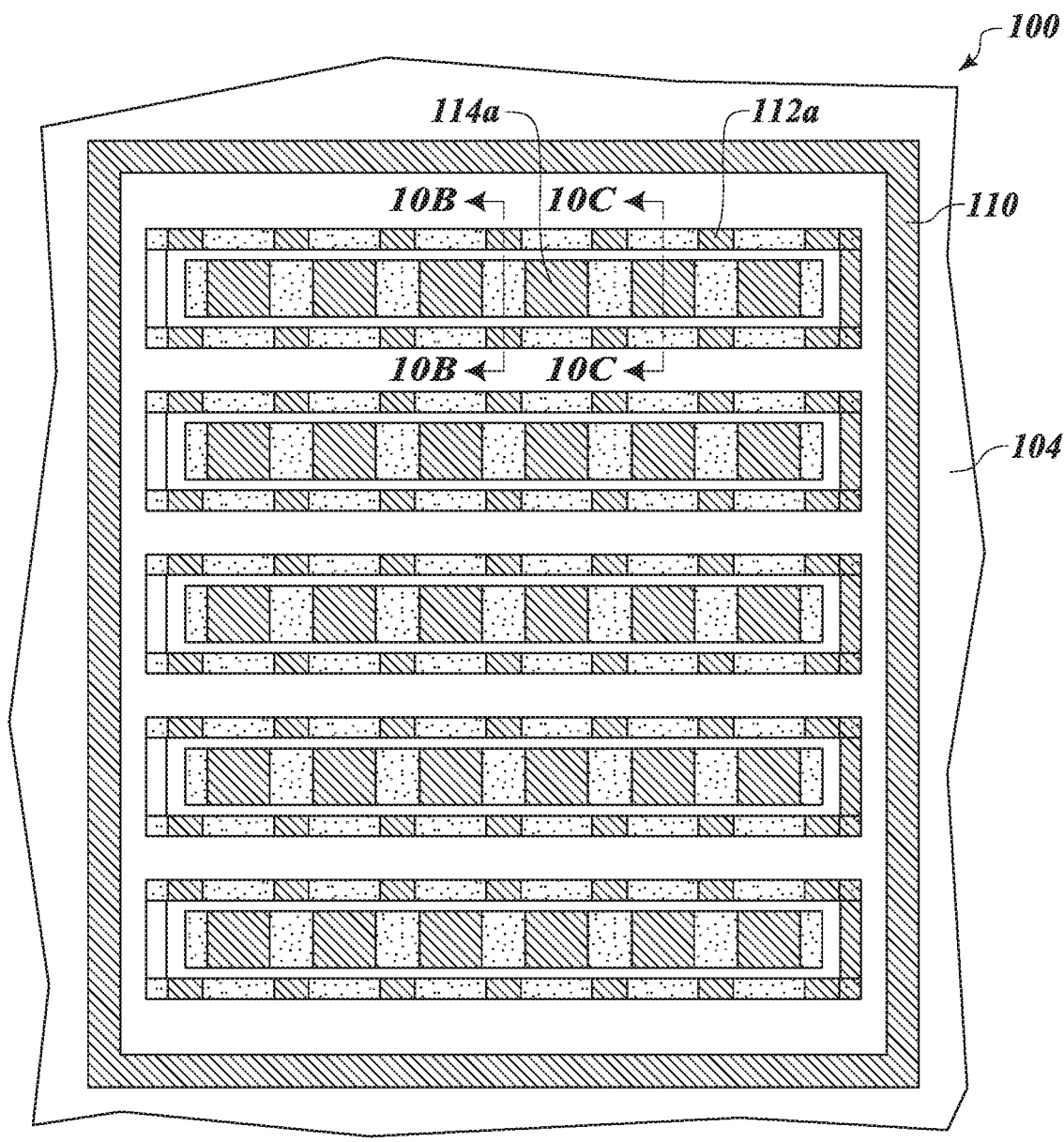
FIG. 10A is a top plan view of an alternative embodiment according to principles of the present disclosure.
Figure 10B:
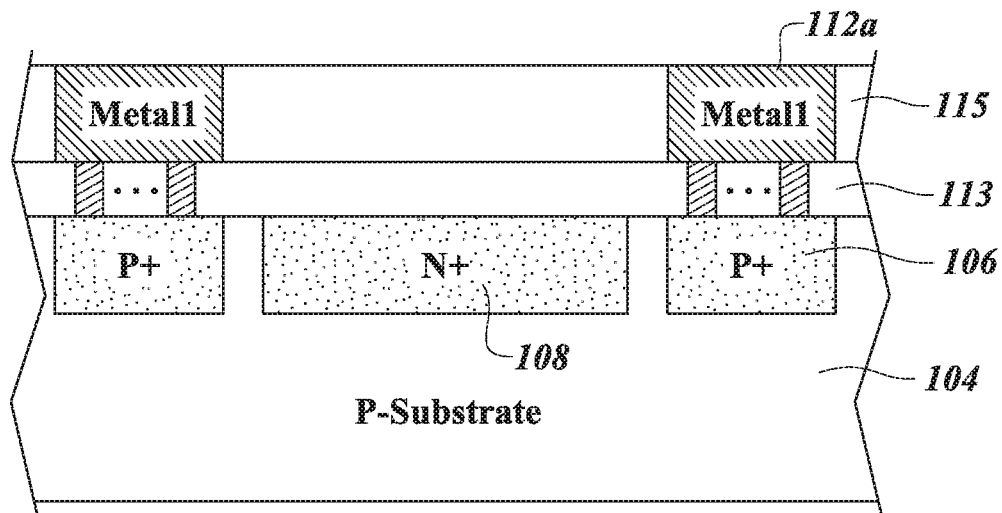
FIG. 10B is a cross-sectional view taken along line 10B-10B of FIG. 10A.
Figure 10C:
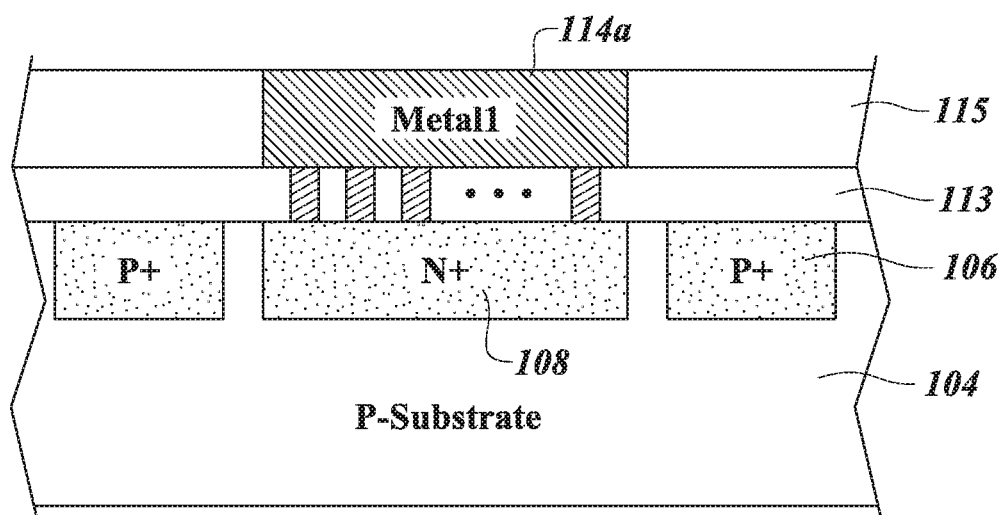
FIG. 10C is a cross-sectional view taken along line 10C-10C of FIG. 10A.

FIGS. 10A-10C illustrate yet another alternative embodiment according to the principles of the present disclosure. In this alternative embodiment, the cathode electrode segments 114*a* are interdigitated with the anode electrode segments 112*a*. In particular, as can be seen viewing FIG. 10A, the cathode electrode segment 114*a* has a selected width, and, in the example shown, there are six such cathode segment portions in a single diode, and each of them are spaced apart from each other by a selected distance. At those locations where the cathode segment portion 114*a* is present, there is no adjacent anode segment electrode 112*a*. Thus, the fringe capacitance is approximately zero, since there is no parallel run length between the cathode electrode and the anode electrode. The anode electrode is also in segments 112*a*, with portions of the anode electrode spaced apart from each other and extending along the length of the anode 106.

As can be seen viewing FIG. 10B, which is a cross section taken along line 10B-10B of FIG. 10A, in all locations where the anode electrode 112 is present, there is no cathode electrode. Similarly, as can be seen in FIG. 10C, in those locations where a cathode electrode is present, there is no anode electrode. Thus, the fringe capacitance due to metal1 is reduced to approximately zero, and there is no contribution from the cathode or anode electrodes to increasing the capacitance of the overall diode bank 100. The rest of the diode is completed in FIGS. 10A-10C in a manner similar to that shown in FIGS. 5A-7E. In particular, metals 2 through 5 are laid on top of metal 1 in order to provide electrical connections of the cathode 108 and the anode 106 to the appropriate nodes of the circuit to be protected. In one embodiment, the via over the cathode and anode between the metals is a continuous strip of that shown in embodiments of FIGS. 5A-7E.

As shown in FIGS. 9A and 9B, the contacts on the cathode are made discontinuous, to reduce the parallel run length of metal 1, but the contacts on the anode electrode are continuous, In an embodiment, the additional via and metal layers above the discontinuous cathodes of FIGS. 9A and 9B are a continuous metal strip that is able to provide additional current carrying capability if there is a noise event.

Figure 11A:
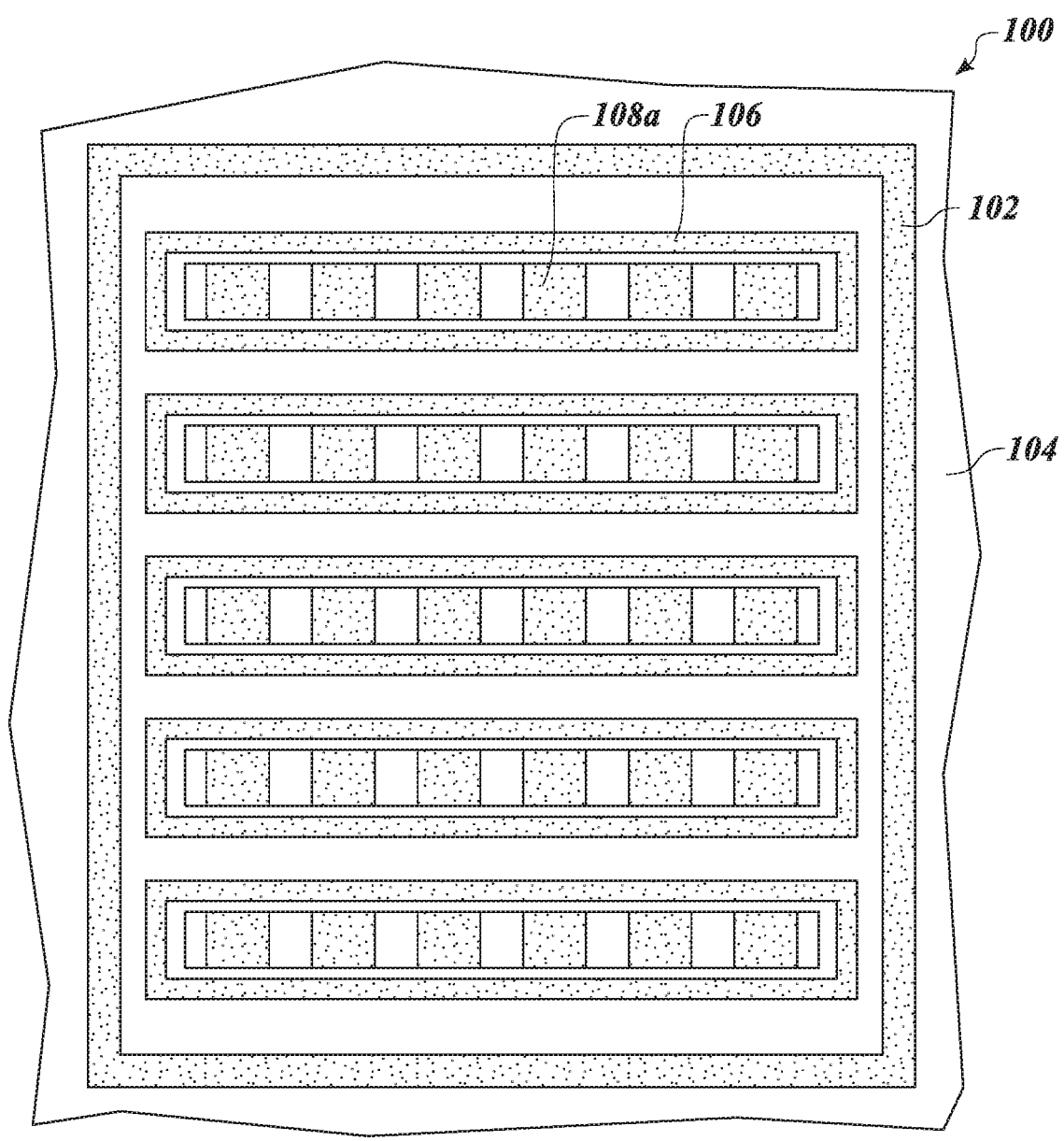
FIG. 11A is a top plan view of an alternative embodiment according to principles of the present disclosure.

FIGS. 11A-11D illustrate yet a further alternative embodiment according to principles of the current disclosure. FIG. 11A illustrates a top plan view of the substrate 104 and the doped areas that comprise the cathode 108 and the anode 106. In particular, the cathode 108 in the substrate is made discontinuous, while the anode 106 is continuous to surround the entire cathode. In particular, the cathode 108 is separated into individual segments 108*a*, each of which makes up a portion of one cathode 108. Between the individual cathode segments 108*a*, the silicon substrate 104 is present or, in one embodiment, STI is present. Accordingly, the overall diode area is reduced.

Figure 11B:
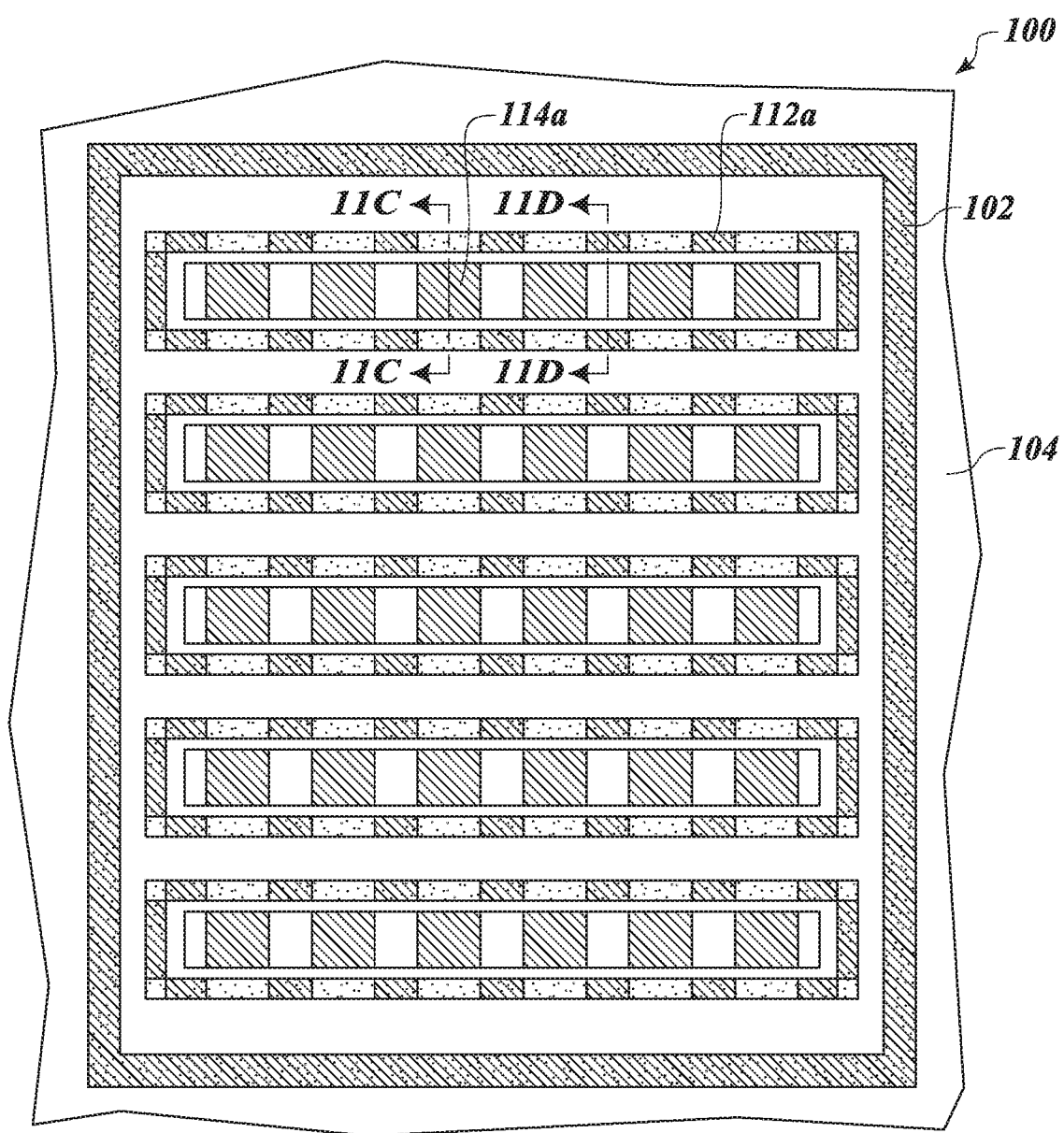
FIG. 11B is a top plan view of the structure of FIG. 11A with a metal layer added.

As shown in FIG. 11B, the cathode electrode segments 114*a* are exactly the same area and exactly on top of the cathode segments 108*a*, and the anode electrode 112 is positioned only at those locations of the diode in which no cathode doping is present.

Figure 11C:
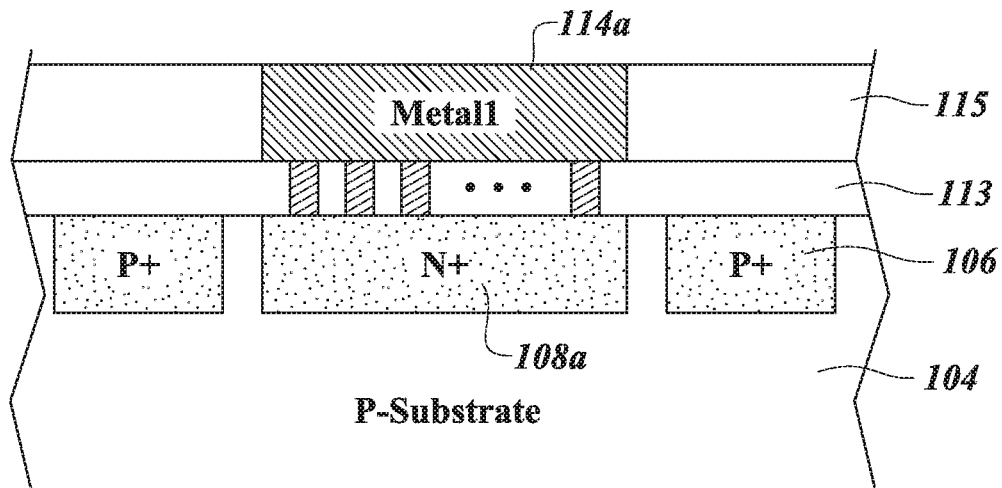
FIG. 11C is a cross-sectional view taken along line 11C-11C of FIG. 11B.

FIG. 11C is a cross-sectional view taken along lines 11C-11C from FIG. 11B. As can be seen, the anode 106 is present to provide the diode function adjacent to the cathode 108; however, there is no anode electrode segment 112*a* at this location. The cathode electrode 114*a* is provided as a segment directly above the cathode segment 108*a*. Thus, the cathode electrode segment 114*a* is exactly the same surface area as the cathode 108 itself; each of them being individual segments that are spaced from each other along the length of the entire cathode.

Figure 11D:
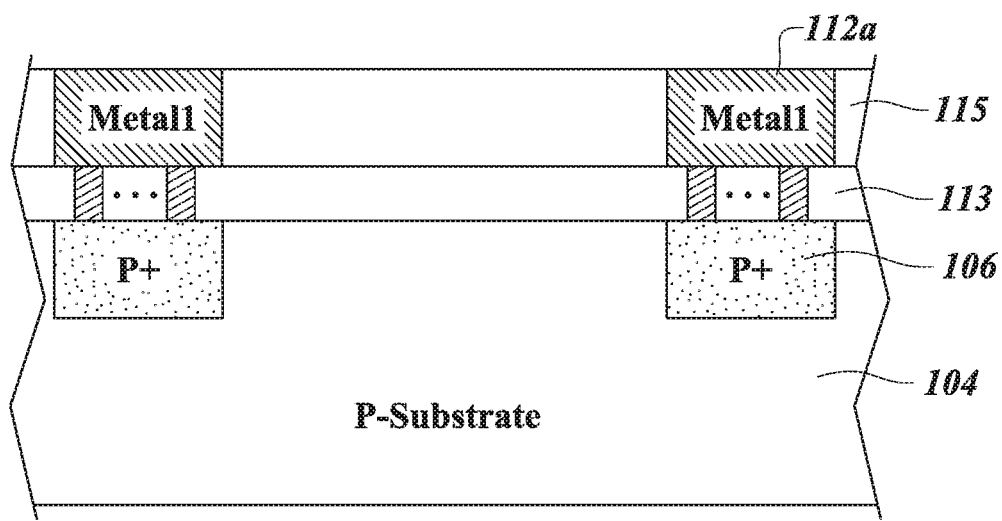
FIG. 11D is a cross-sectional view taken along line 11D-11D of FIG. 11B.

FIG. 11D shows a cross-sectional view taken at location 11D-11D as shown in FIG. 11B. At this location, the anode 106 remains continuous, and an anode electrode segment 112*a* is present at this location. However, there is no cathode doping in the substrate 104, and therefore the capacitance which might be present between the cathode electrode 114*a* and the anode electrode 112*a* is not present. Thus, the overall capacitance of the entire device is substantially reduced by using the individual segments of the cathode for each of the diodes.

In the proposed embodiment of FIGS. 11A-11D, the piece-wise cathode provided in individual segments can be aligned in a row with individual columns along the diode bank 100. The cathode segments are therefore aligned in vertical columns as can be seen in FIG. 11A. The anode electrode 112*a* can be in individual segments, as shown in FIG. 11B, or, alternatively, the anode 112 can be a single continuous metal 1, as shown with respect to FIG. 4A. The vias for the individual metal layers 2-5 over the cathode and the anode between metals, can be continuous with continuous metal strips similar to that shown with respect of FIGS. 5A-7E.

Figure 12B:
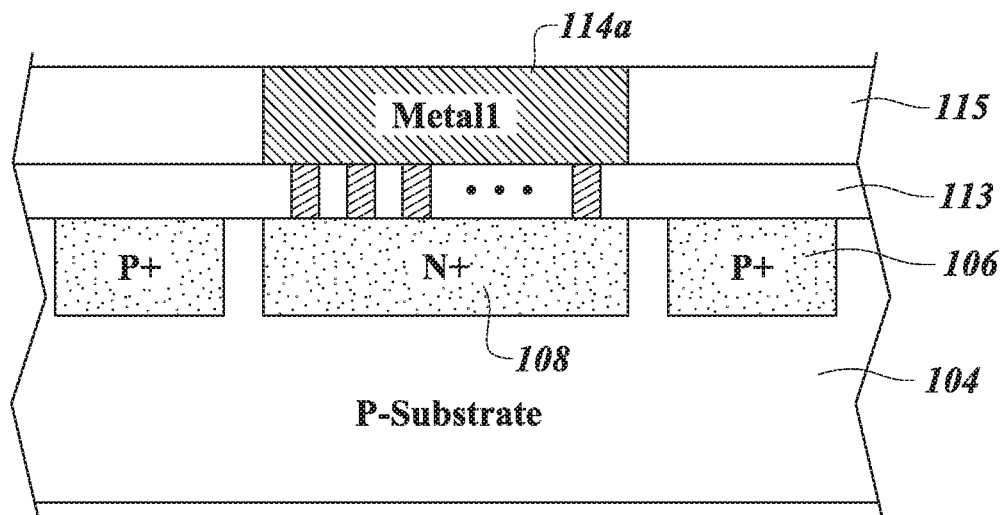
FIG. 12B is a cross-sectional view taken along line 12B-12B of FIG. 12A.
Figure 12C:
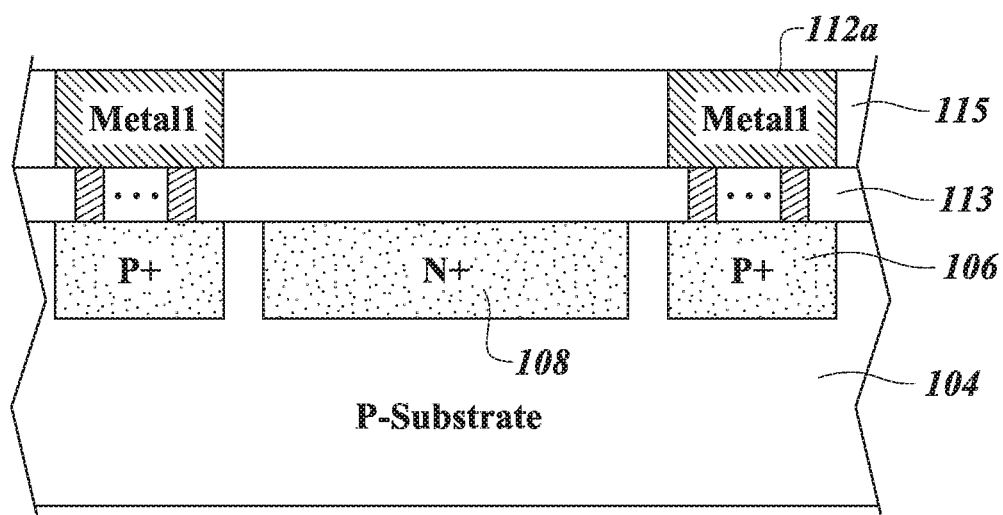
FIG. 12C is a cross-sectional view taken along line 12C-12C of FIG. 12A.

FIGS. 12A-12C illustrate two additional alternative embodiments according to principles of the present disclosure. According to a first alternative, the cathode electrode segments 114a are provided as individual segments within the single continuous cathode 108 and arranged in columns with the cathode electrode 114a extending in a column rather than along the row. In particular, as can be seen viewing FIG. 12A, the cathode electrode 114 extends in the column and contacts the cathode 108 at individual segment locations labeled 114a, as can best be seen by viewing FIGS. 12A and 12B together. The cathode electrodes 114a therefore extend in parallel columns perpendicular to the cathode 108 itself, which extends as a single row to each diode, and a plurality of rows are provided. Accordingly, as can be seen, the cathode 108 extends in parallel horizontal rows, whereas the cathode electrode 114a extends in parallel vertical columns. Each individual cathode electrode 114a contacts each individual cathodes 108a-108n of the diode bank 100. A single cathode electrode 114a thus provides the function of tying each of the cathodes 108a-108n of the entire cathode bank to each other, in order to provide a large diode of individual cathodes coupled to each other. Similarly, the anode electrode 112 extends in columns vertically upward to contact the anode at two locations within each individual diode 100a-100n. The anode electrode therefore also runs perpendicular to the anode itself for each of the individual diodes 100a-100n. The anode electrode 112 contacts the anode 106 at two locations designated 112a, as can be seen viewing FIG. 12C.

In a first embodiment, the anode 108 and the cathode 106 are continuous in the silicon substrate similar to that shown in FIG. 3A.

In one alternative embodiment, the cathode 108 is in segments similar to that shown in FIG. 11A. Specifically, the cathode is present inside each diode 100a only at the specific location in which it is contacted by the cathode electrode 114a. There is no doping, and thus no cathode present in the substrate at those locations which are not overlapped by the cathode electrode 114a, similar to that embodiment as shown in FIGS. 11A-11D. Thus, FIGS. 12A-12C illustrate two alternative embodiments, one in which the cathode is continuous in each of the rows 100a-100n, and another embodiment in which the cathode is in individual segments within each diode row 100a-100n.

In one embodiment, the anode 106 is kept continuous, as illustrated in FIGS. 12A-12C. In another alternative embodiment, the anode can have discrete segments with discrete contacts over it, and the cathode can be continuous.

As illustrated in FIG. 12A, the direction of the metal for both the anode electrode 112a and the cathode electrode 114a is kept such that there is no overlap between the two nodes, and therefore no overlap parasitic capacitance. Further, the space in-between them of the distance d is selected to have a sufficient distance d that the fringe capacitance is very small. Thus, while the cathode and anode electrodes both extend parallel to each other, the only possible capacitance is the fringe capacitance and, as can be seen in FIG. 12A, at each location where the anode electrode 112a contacts the anode, there is no contact between the cathode electrode 114 and the cathode itself. Thus, the fringe capacitance is reduced to a low value due to only few parallel running metals. The via at the different levels can run parallel to the individual cathode rows 100a-100n of the layout as shown in FIGS. 5A-7F or, alternatively, can imitate that of the layers shown in FIGS. 12A-12C.

FIGS. 13A-13D illustrate yet a further alternative embodiment which has high power dissipation capabilities, and yet has reduced overlap capacitance. In the embodiment of FIGS. 13A-13D, an end 191 has no doping for an anode present. All the doping for the anode is directly underneath the anode electrode 112, and no anode electrode or anode doping is provided in the substrate at the end 191. The anode electrode 112 is therefore the exact shape of the anode, and has the same area. This will substantially reduce the overlap capacitance and the fringe capacitance that would otherwise be present between the anode electrode 112 and the cathode electrode 114.

Figure 13B:
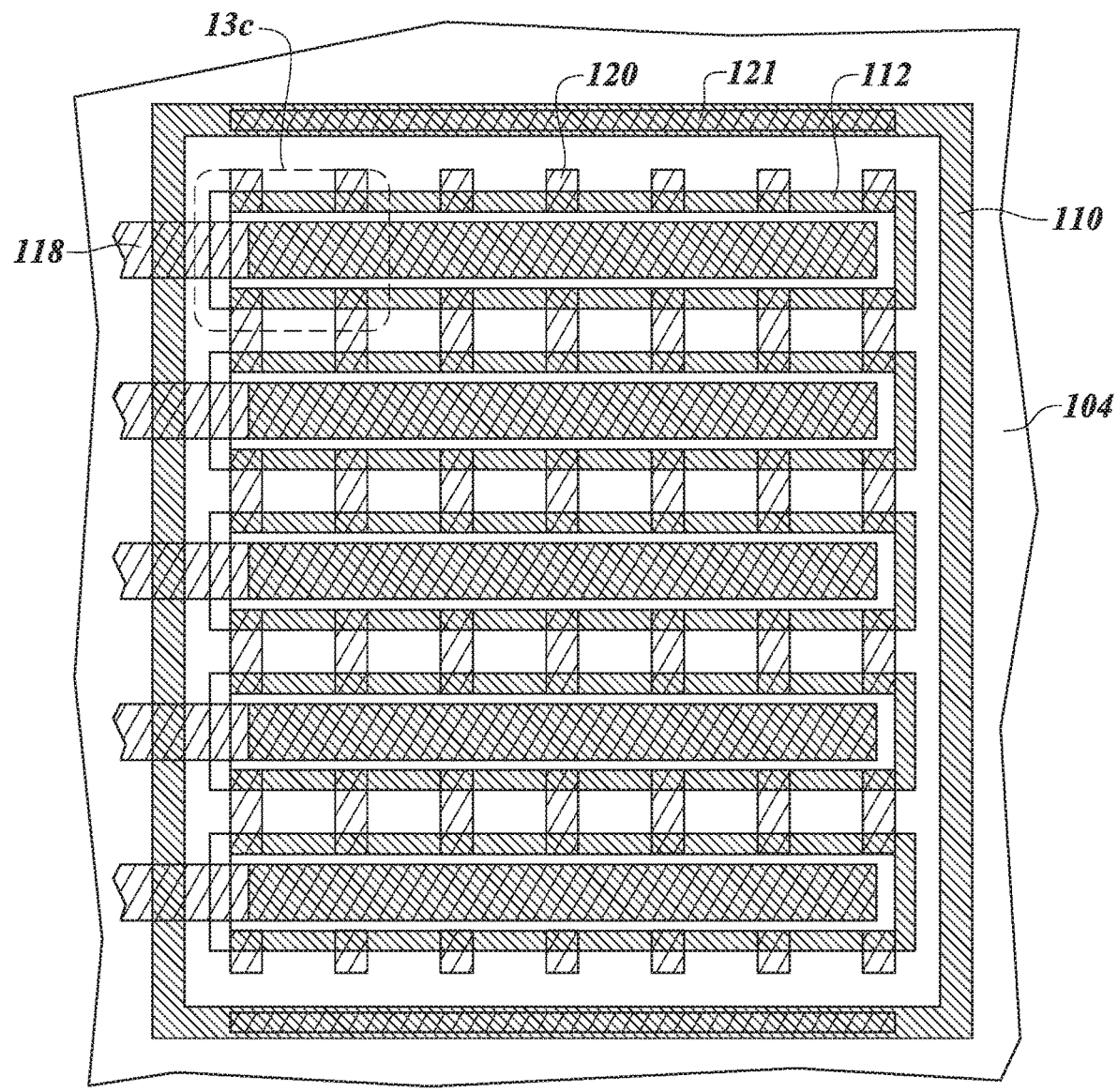
FIG. 13B is an enlarged view of section 13B from FIG. 13A.

As shown in FIG. 13B, the metal 2 via 118 overlays on top of the cathode exactly, and has electrical connections to the cathode electrode 114, to provide a high current carrying capability for the cathode to dissipate power for a noise event.

Figure 13C:
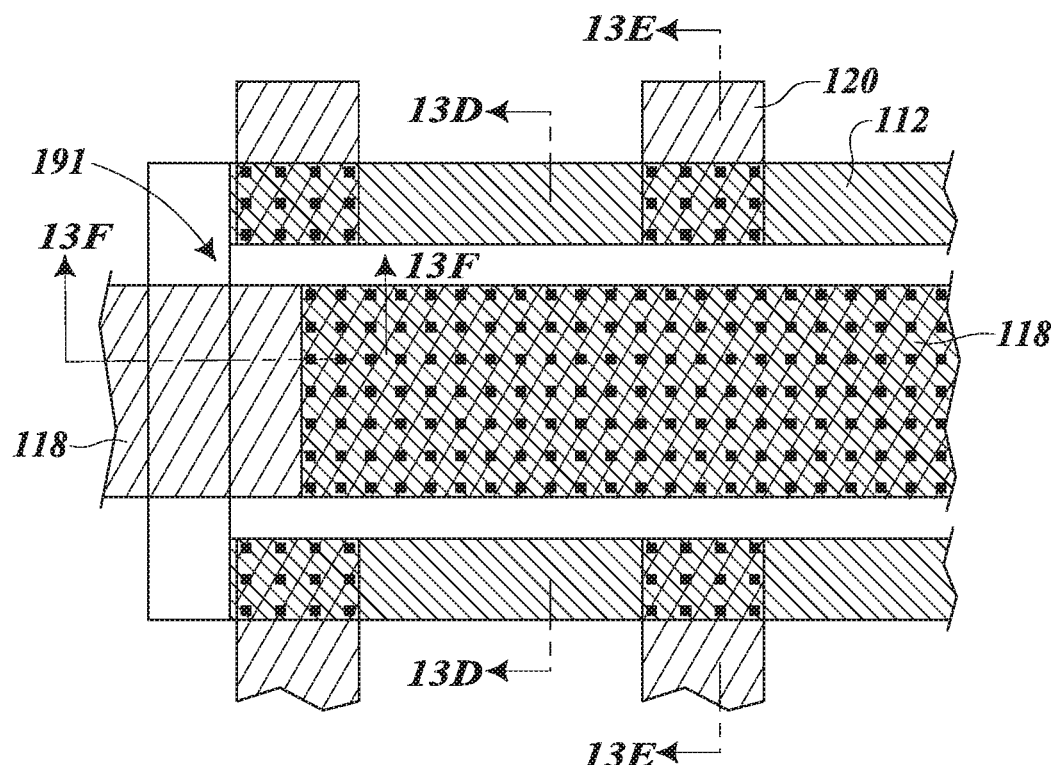
FIG. 13C is a cross-sectional view taken along line 13C-13C of FIG. 13B.
Figure 13D:
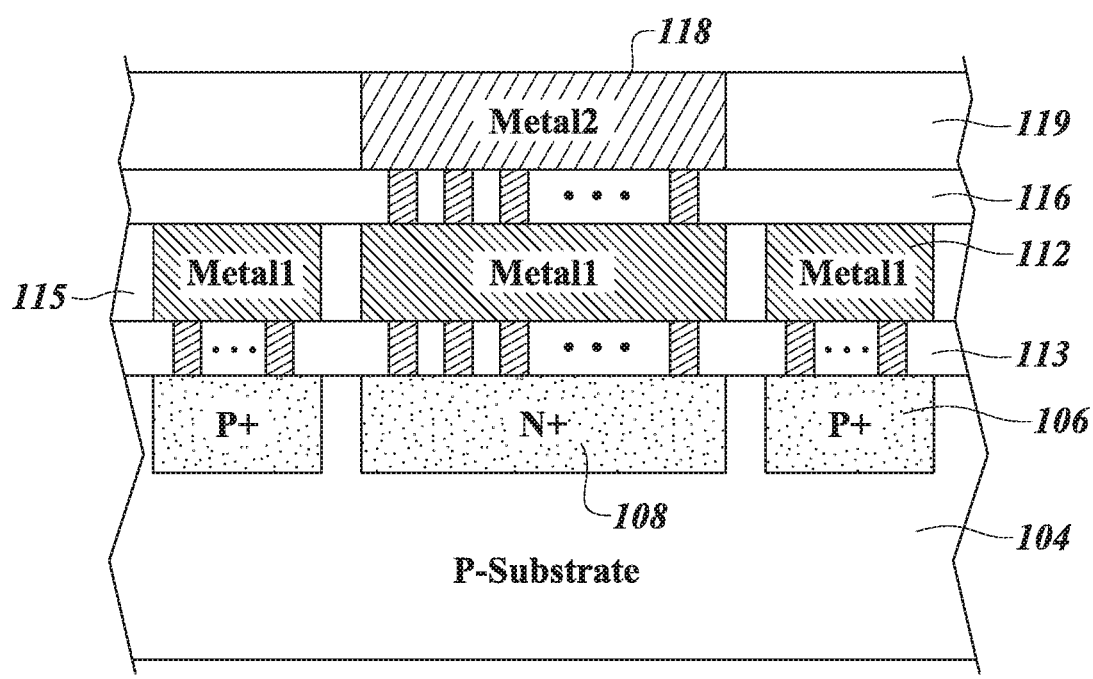
FIG. 13D is a cross-sectional view taken along line 13D-13D of FIG. 13B.
Figure 13E:
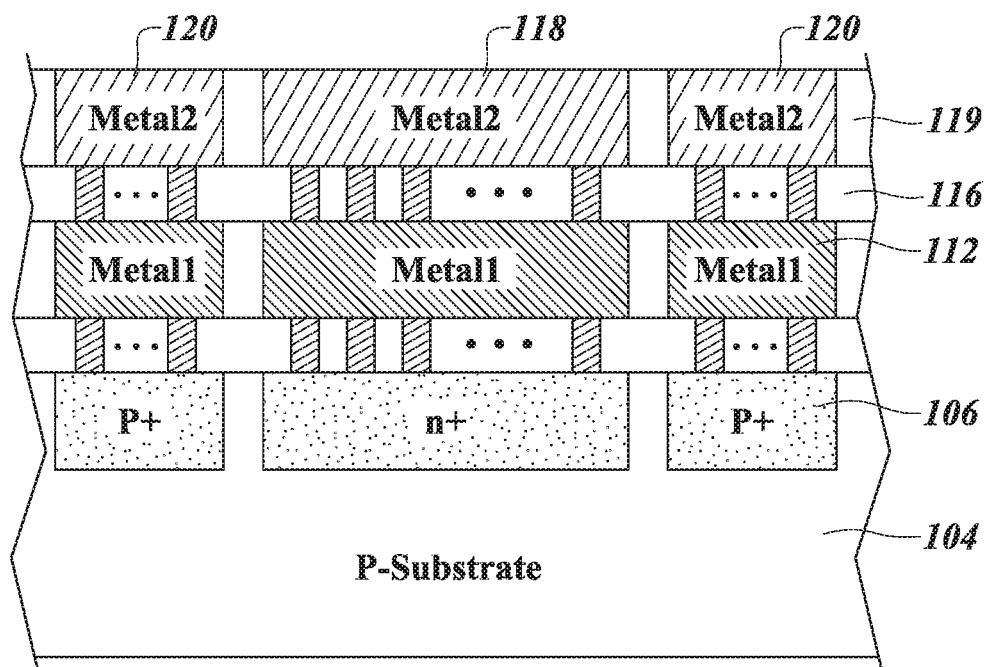
FIG. 13E is a cross-sectional view taken along line 13E-13E of FIG. 13B.
Figure 13F:
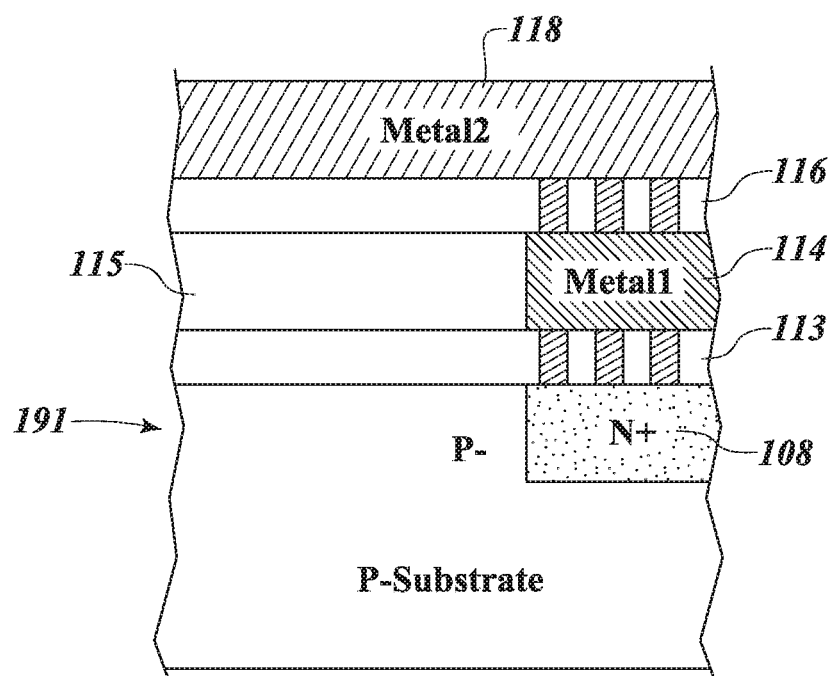
FIG. 13F is a cross-sectional view taken along line 13F-13F of FIG. 13B.

FIG. 13C is an enlarged view of the section 13C from FIG. 13B. As can be seen, the via 120 for metal 2 is at individual segment locations similar to that shown with respect to FIGS. 5A-5C, and therefore has a reduced fringe capacitance and no overlap parasitic capacitance. Metal 2 for the cathode connection 118 has a surface area that completely overlaps the cathode 108 as well as the cathode electrode 114, while extending beyond each individual diode 100a-100n to be connected to a voltage source in order to discharge the current to protect the circuit against a noise event, as can be seen in FIGS. 13D and 13E. FIG. 13F illustrates a cross-sectional view taken along line 13F-13F of FIG. 13C. This illustrates that the metal 2 for the cathode via connection is electrically connected to the cathode electrode 114, which contacts the cathode 108. However, at the end 191 of the diode in each row, there is no anode in the substrate at that particular location. Accordingly, there is no overlap capacitance because of the anode electrode. Therefore, there is no overlap parasitic capacitance in the embodiment of FIGS. 13A-13F.

In another embodiment the no anode region 191 is extended on both sides of cathode.

As with the previous embodiments, the cathode and/or anode can be designed to be continuous over their entire lengths, or they can be discrete, with discrete contacts over each of them. The via metal connections for metals 2-5 over the cathode and anode between the metals can also be as illustrated in prior embodiments. The direction of the metal for the anode and the cathode is kept such that no overlap between the two nodes occurs. Further, in the embodiment of FIGS. 13A-13F, the direction of the metals for the cathode electrode and all vias above it, as well as for the anode electrode and all vias above it, are the same for the cathode and the anode themselves and the silicon. Thus, the cathode metal runs in the same direction and directly overlaps the cathode itself, and the anode electrode, together with the anode via metals and connections, are also in the same direction as the anode, and completely overlap the anode itself.

In one preferred embodiment, the anode connection for the embodiment of FIGS. 12A-12C and 13A-13F are the same as that shown in FIG. 8. Specifically, the anode connection 138 is on the far right-hand side, and extends in parallel strips to directly overlay each of the anodes. It provides a parallel connection between adjacent anodes of adjacent diode rows 100a-100n. The cathode connection comes from the other side, similar to that shown in FIG. 8, and electrically connects metal 5, layer 138, to the individual cathode electrodes 114, a via being provided where metal 5 138 is overlapped by 118, metal 2 of the cathode via connection.

All the structures discussed in FIG. 3A-13F can be also be flipped in any possible rotations like 90 degrees or 180 degrees or mirror along x-axis or y-axis.

Figure 14A:
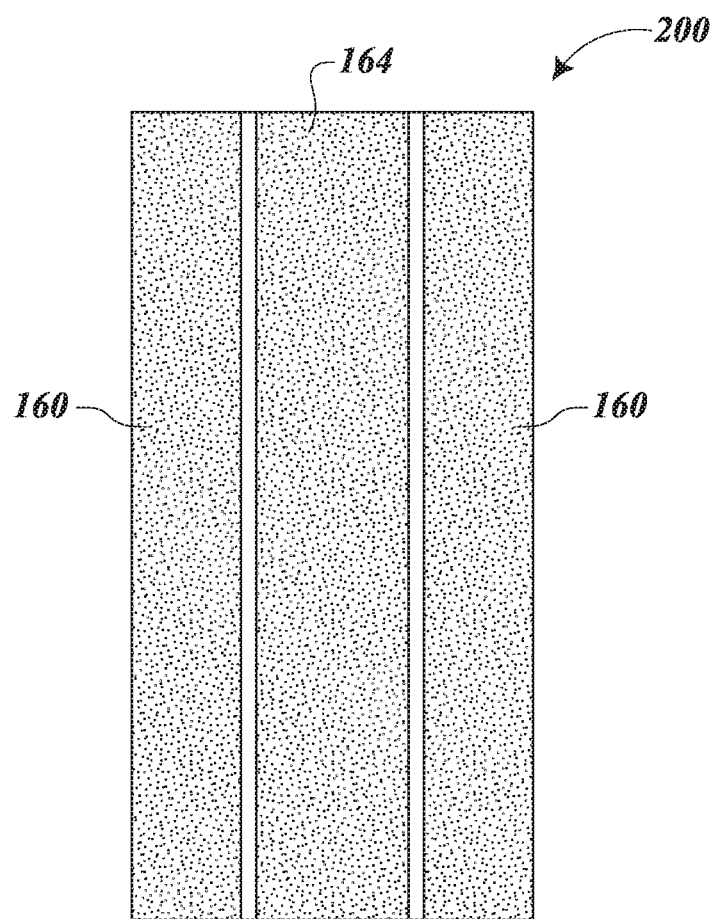
FIG. 14A is a top plan view of a single diode of an alternative embodiment according to principles of the present disclosure.
Figure 14B:
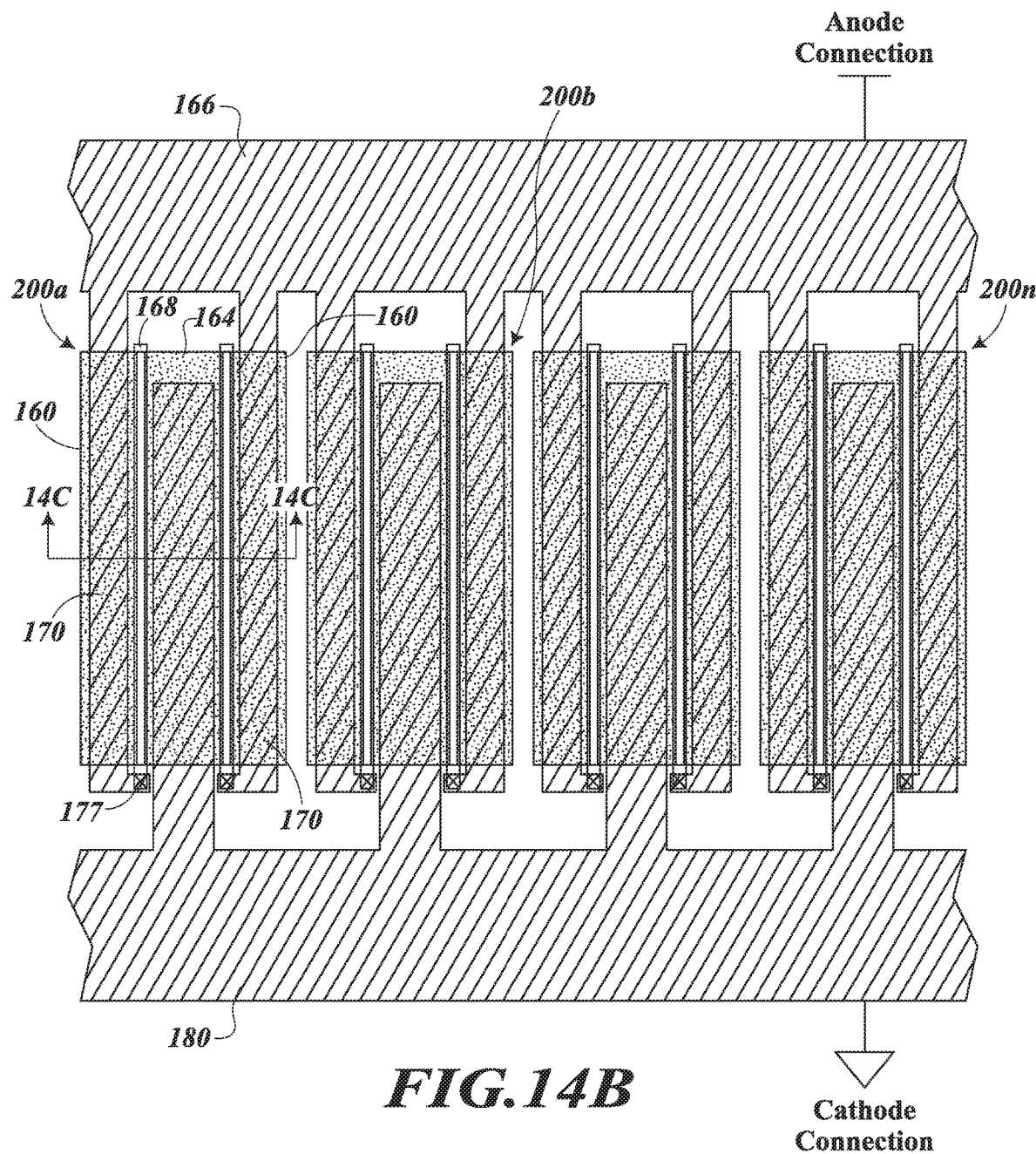
FIG. 14B is a top plan view of a bank of diodes, electrically connected together, using the diode pattern from FIG. 14A.
Figure 14C:
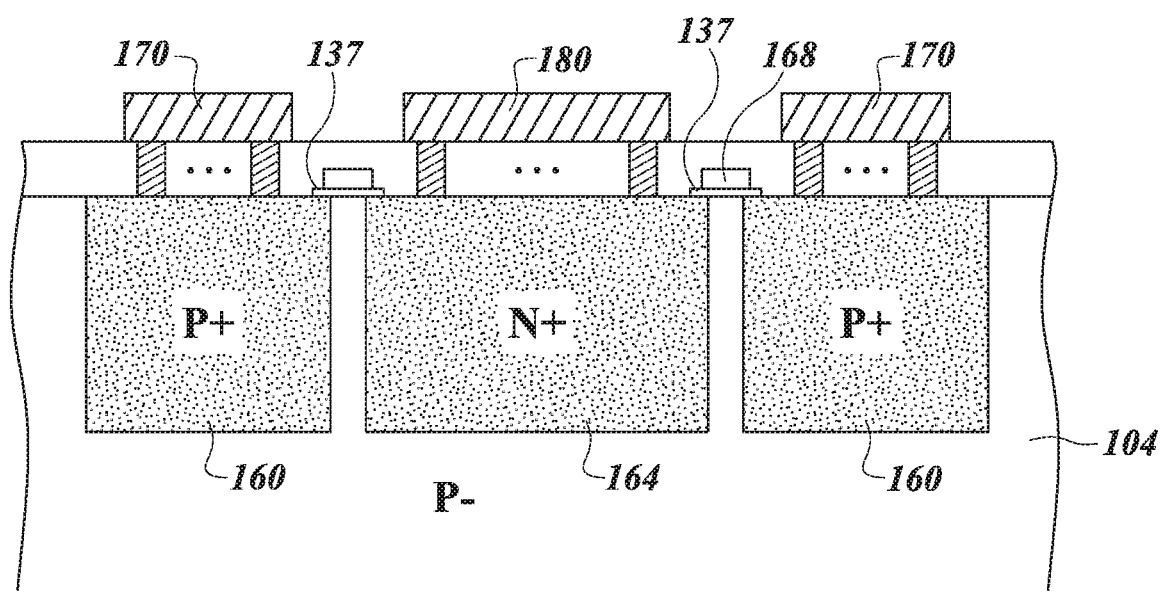
FIG. 14C is a cross-sectional view taken along line 14C-14C of FIG. 14B.

FIGS. 14A-14C illustrate yet a further alternative embodiment which provides similar benefits but is of substantially different construction than that which is shown in FIGS. 3A-13F. In particular, FIGS. 14A-14C illustrate a gated diode.

As shown in FIG. 14A, the gated diode has a cathode 164 in a central region doped in the substrate, and anode 160 on either side of the cathode 164. Illustrated in FIG. 14A is a single diode for ease in illustration. However, as will be appreciated, this diode is replicated several times, in a single row which extends for dozens of identical diodes or in two more parallel rows, each of which contains several individual diodes. FIG. 14B illustrates a completed diode of the type shown in FIG. 14A, in which a single row of diodes is shown, which are coupled together to make a bank of a large number of diodes.

As shown in FIGS. 14B and 14C, the diode 200 is replicated numerous times, illustrated as 200a, 200b, to 200n. Each of the diodes 200 includes a cathode 164 in a substrate 104, and adjacent anodes 160. The cathode and anode are in a lightly doped p substrate 104 similar to that previously described with respect to the prior embodiments. A thin dielectric layer 137 is between the cathode 164 and the anode 160 itself on the top of the surface of substrate. A polysilicon gate 168 overlays the dielectric 137. In one embodiment, a polysilicon layer directly overlays and contacts the thin insulation layer 137 and is connected to anode in this case. In particular, a conductive polysilicon layer 168 has about the same footprint and area as the space between the cathode and the anode, providing a large area of electrical field interaction between the cathode 164 and the anode 160. The solution shown in the embodiment of FIGS. 14A-14C is a gated diode. In particular, the individual diode segments act for the voltage difference between the anode electrode 170 and the cathode electrode 180. The gate allows the conduction to take place near the surface and hence allows reduction in inherent diode turn-on resistance compared to diodes with STI in between them. Thus the voltage drop across the diode is less than that of STI diode and hence higher current can be achieved for a smaller diode size for same anode to cathode potential. The gated diode 200 of FIGS. 14A-14C is therefore preferred for higher currents in lower layout area. The diode as shown in FIGS. 14A-14C has the benefit of zero overlap capacitance. Accordingly, the device is able to respond very quickly, with very little lag time between the occurrence of the noise event and when the current can be discharged via the diode. In addition, by selecting the distance between cathode electrode 180 and anode electrode 170 to be somewhat larger than the distance between the cathode 164 and the anode 160, the fringe capacitance can be greatly reduced, also approaching a very low value, Thus, the fringe capacitance is greatly reduced, and the overall parasitic capacitance is near zero.

In the embodiment of FIGS. 14A-14C, the anode electrode 170 is connected with a via 177 to the polysilicon gate 168, which overlies the space between the anode and the cathode, as best seen in FIG. 14B. Specifically, in a preferred embodiment, the polysilicon gate 168 is connected to the anode 160 via the anode electrode 170. Thus, when the voltage on the anode exceeds a selected threshold value, the diode turns on, and current is conducted from the anodes 160 to the cathode 164.

As can be seen, the gated diode 200 of FIGS. 14A-14C is constructed with no overlap capacitance within the diode structure itself for the anode 160 and the cathode electrode 180 or with the cathode 164 and the anode electrode 170. In addition, there is no overlap capacitance between the cathode electrode 180 and the anode electrode 170.

All the embodiments discussed so far can be replicated with cathode and anode being replaced or switch places with each other such that anode is substantially enclosed by the cathode. This solution can be extended to design a MOSFET with very low parasitic capacitance and zero overlap capacitance using the technique used for gated diode in FIG. 14A-14C, as explained elsewhere herein.

The construction of gated diode can, in one embodiment, be completed at the structure shown in FIGS. 14B and 14C. In one embodiment, the construction of the gated diode continues in a manner corresponding to that for the diode shown in FIGS. 4-8. The similarity between the structure of FIG. 4B at metal one and the structure of FIG. 14C, also at metal one can be seen. In some embodiments, additional metal layers two-five or more are added to the structure of FIGS. 14B and 14C in the same way and corresponding locations that metal layers are added to the structure of FIG. 4B, as taught in FIGS. 4A-8. These additional FIGS. for 14B and 14C are not provided to save space and a person of skill in the art would know how to construct such a gate diode 200 with zero overlap capacitance having the various metal layers two through five or more using the techniques taught herein for the diode 100.

Figure 15A:
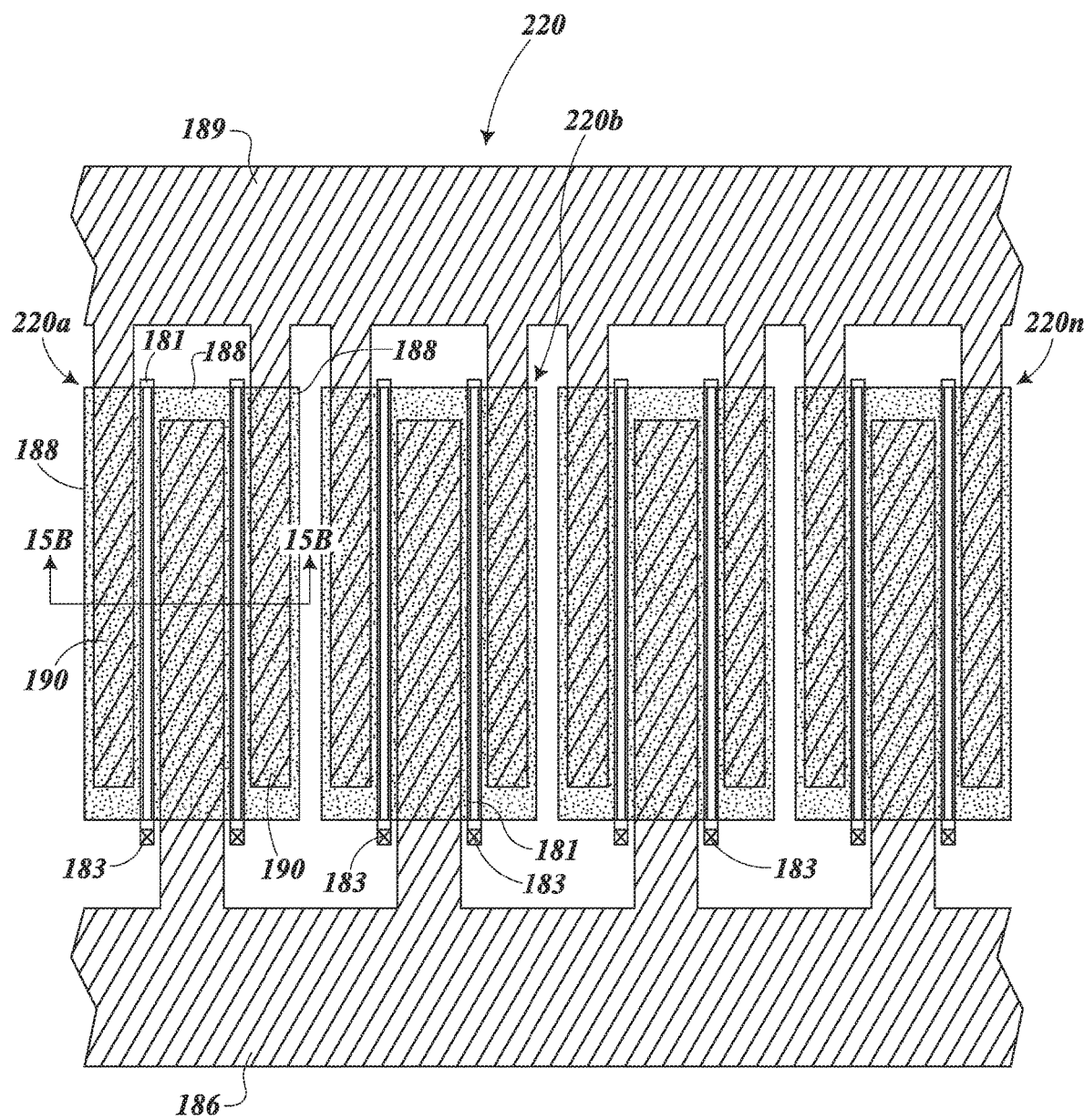
FIG. 15A is a top plan view of an MOS transistor of an alternative embodiment according to principles of the present disclosure.
Figure 15B:
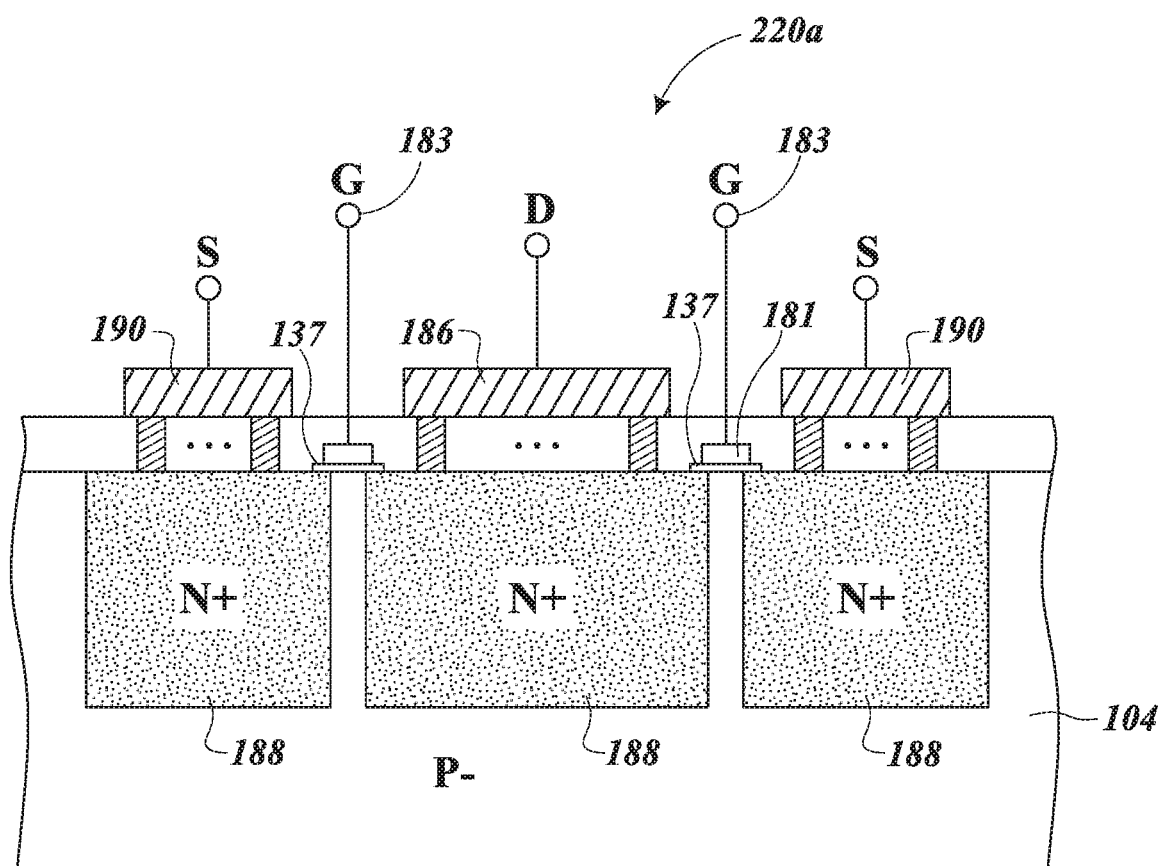
FIG. 15B is a cross-sectional view taken along the line 15B-15B of FIG. 15A.
Figure 15C:
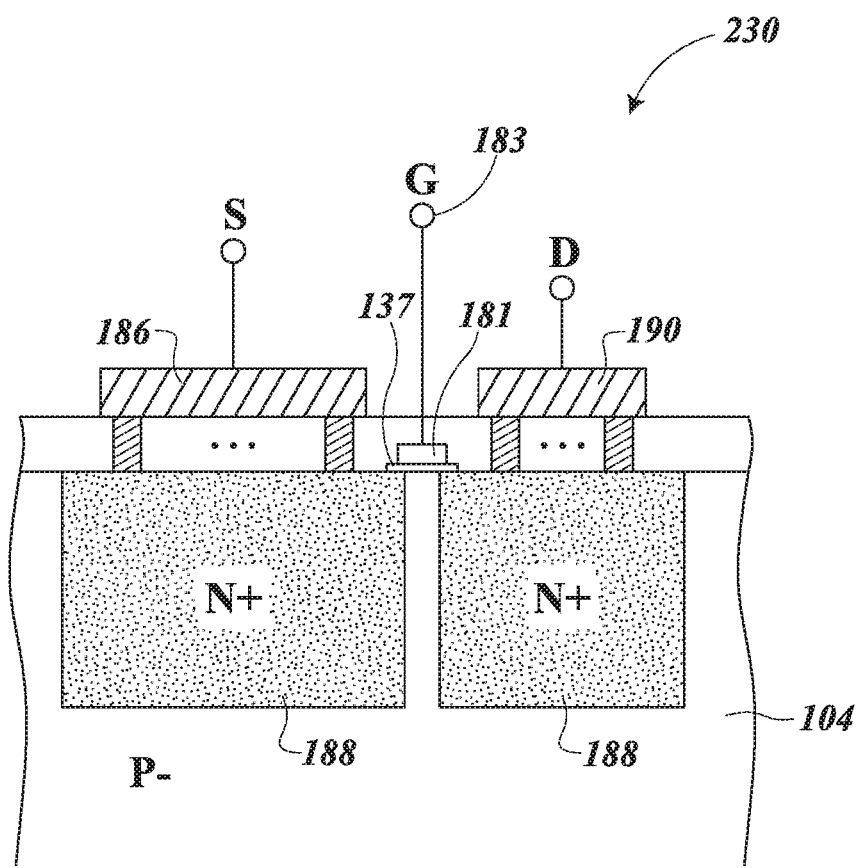
FIG. 15C is a further alternative embodiment of an MOS transistor according to principles of the present disclosure.

FIGS. 15A-15C illustrate MOS transistors constructed according to the principles as disclosed herein, in order to have very low parasitic capacitance and little or no overlap capacitance, using the same techniques discussed with respect to the gated diode and the diode of the previous figures.

FIG. 15A shows a bank 220 of MOS transistors, each transistor being respectively labeled 220a, 220b, 220n. In the example shown in FIG. 15A, a source bus line 189 connects all of the sources electrodes 190 to each other. A drain bus line 186 connects all of the drains electrodes to each other. A gate 181 overlies the channel region of the transistor, which is in substrate 104 and is doped of the P-type. N+ doped regions 188 are the source and drain regions, as can be seen in FIGS. 15A and 15B. The gate 181 is coupled to a gate electrode 183, shown in FIGS. 15A and 15B. The gate electrode 183 is connected to other circuits in the same integrated circuit and on the substrate, but not shown for convenience. These other circuits can apply a voltage to the gate electrode 183, and therefore enable the respective transistors to be conductive or nonconductive, depending on the voltage which is applied to the gate 181.

Viewing FIG. 15A, it can be seen that the source electrode bus 189 and the individual sources electrodes 190 do not overlay the drain electrode bus 186 nor the drain electrodes 186. Accordingly, there is no overlap parasitic capacitance in this design. Each of the MOS transistors 220a, 220b to 220n operates based on the voltage applied to the gate electrode, and not have their speed compromised or reduced because the source or the drain electrodes, or the source or the drain electrode buses, overlap each other and have an increased capacitance.

In the design of FIGS. 15A-15C, as well as in the design of FIGS. 14A-14C, additional metal layers can be deposited overlying the respective buses 166, 189, as well as 180 and 186, as well as the respective fingers 170, 180, 190 using the same principles taught in FIGS. 4-7F. While only a first metal level is shown in FIGS. 14A-15C, it will be expected that additional metal layers, similar to those shown in the prior figures, including metals 2, 3, 4, 5, or more, will overlie metal 1 in a similar fashion to the organization of those metal layers in FIGS. 5C-13F. Accordingly, in each of the various metal levels, the design is set to reduce and, in some cases, eliminate all overlap parasitic capacitance and reduce as much as practical of the fringe parasitic capacitance; the result being that the response of the MOS transistor bank 220 is faster than was previously possible with source and drain electrodes and source and drain buses which overlapped each other and thus had considerable parasitic capacitance, both overlap and fringing.

FIG. 15B is a cross-sectional view of FIG. 15A, as indicated. As can be seen, the gate contact electrode 183, which is shown in FIG. 15A, is available for connecting to a switching voltage or a drive voltage in order to drive the gate 181 to a desired level. The sources and drains are respectively labeled as S or D in FIG. 15B.

FIG. 15C is an alternative embodiment in which only a single transistor 230 is formed, instead of a bank of transistors 220. In this single transistor 230, a design similar to that of FIGS. 15A and 15B is used. However, it is a stand-alone transistor rather than in a bank of transistors, as can be appreciated from a comparison to FIG. 15A. The transistor 230 has a source electrode 186 and a drain electrode 190, which may be different or the same width, depending on the preferred embodiment. Often, the source electrode is connected to many different voltage nodes on a circuit, and must ensure that all voltage is fully grounded, and therefore it may be somewhat larger or wider as a grounding node than a drain node 190. Alternatively, it could be exactly the same size and shape as the drain electrode 190.

In a similar fashion to the operation of the transistors shown in FIGS. 15A and 15B, the transistor of FIG. 15C has a gate oxide 137, on top of which is a gate 181. The gate overlays a P-type channel region, and is between two N+ doped regions 188 within the substrate 104. The transistor 230 operates under standard transistor principles, which need not be discussed here, since they are well known in the art. In the final structure of FIG. 15C, additional metal levels will be provided above metal 1 in a fashion similar to that shown in FIGS. 4A-7F, and therefore are not described here in detail. The transistor is organized, and has electrical connections which do not overlap each other if they will have a different voltage supply to the respective metal connections. Accordingly, the overlap capacitance is eliminated completely.

As can be seen, the MOS transistor of 220 of FIGS. 15A-15C is constructed with no overlap capacitance within the MOS structure itself for the gate electrode, source and drain and their respective electrodes.

The construction of MOS transistor 220 can, in one embodiment, be completed similar to the structure shown in FIGS. 14B and 14C. In one embodiment, the construction of the MOS transistor 220 continues in a manner corresponding to that for the diode shown in FIGS. 4-8 and the gated diode 200 as described. The similarity between the structure of FIG. 4B at metal one and the structure of FIGS. 15B and 15C, also at metal one can be seen. In some embodiments, additional metal layers two-five or more are added to the structure of FIGS. 15B and 15C in the same way and corresponding locations that metal layers are added to the structure of FIG. 4B, as taught in FIGS. 4A-8. These additional FIGS. for 15B and 15C are not provided to save space and a person of skill in the art would know how to construct such a gate diode 200 with zero overlap capacitance having the various metal layers two through five or more using the techniques taught herein for the diode 100.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A diode, comprising:
a semiconductor substrate;
a cathode region in the semiconductor substrate;
an anode region in the semiconductor substrate and around the cathode region, the anode region being spaced from the cathode region by a first distance in a first direction;
a first insulation layer directly over the semiconductor substrate;
a cathode electrode electrically coupled to the cathode region and having a first area that corresponds to and directly covers a second area of the cathode region, the cathode electrode including a first metal layer;
an anode electrode electrically coupled to the anode region and having a third area that corresponds to and directly covers a fourth area of the anode region, the anode electrode including the first metal layer;
a second insulation layer directly over the first metal layer of the cathode and anode electrodes;
a second metal layer having a first portion that directly overlays the cathode electrode and a plurality of second portions, each second portion being spaced from an adjacent one of the plurality of second portions by a second distance in a second direction that is transverse to the first direction.

2. The diode of claim 1 wherein the second metal layer has a cathode voltage supply portion that extends from the cathode electrode to a voltage supply node, the cathode voltage supply portion directly overlying a portion of the anode region and the anode electrode.

3. The diode of claim 1 wherein the first portion of the second metal layer overlays the entire cathode electrode and the anode electrode is not covered by the first portion of the second metal layer.

4. The diode of claim 1 wherein the anode region completely surrounds the cathode region.

5. The diode of claim 1 wherein the cathode region includes a longer dimension and a shorter dimension, the anode region is positioned along the longer dimension of the cathode region and is not positioned along the shorter dimension of the cathode region.

6. The diode of claim 1 wherein the anode electrode has exactly the same footprint as the anode region.

7. A diode, comprising:
a semiconductor substrate;
a cathode region in the semiconductor substrate;
an anode region in the semiconductor substrate and around the cathode region, the anode region being spaced from the cathode region;
a first insulation layer directly over the semiconductor substrate;
a cathode electrode having:
   a plurality of cathode contact portions spaced from each other, each cathode contact portion being separated from an adjacent one of the plurality of cathode contact portions by a first space in a first direction;
an anode electrode having:
   a plurality anode contact portions, each anode contact portion being separated from an adjacent one of the plurality of anode contact portions by a second space in the first direction, each of the anode contact portions being physically positioned between adjacent ones of the cathode contact portions along the first direction.

8. The diode of claim 7 further including:
a first metal layer, the cathode electrode being formed from the first metal layer;
a second insulation layer directly over the first metal layer;
a second metal layer having:
   a plurality of cathode via portions spaced from each other, each cathode via portion being spaced from an adjacent one of the plurality of cathode via portions by a third distance, each of the cathode via portions being in electrical contact with a respective cathode electrical contact portion; and
   a plurality of anode via portions spaced from each other, each anode via portion being spaced from an adjacent one of the plurality of anode via portions by a fourth distance, each of the anode via portions being directly over a respective one of the anode contact portions, each of the anode via portions being between adjacent ones of the cathode via portions.

9. The diode of claim 7 further including:
an upper metal layer having a first portion that has a first width and that extends in a continuous strip and directly overlying all of the cathode via portions and electrically coupling all the cathode via portions to each other,
the upper metal layer having a second portion that has a second width, the second portion overlying all of the anode via portions and electrically coupling all of the anode via portions to each other.

10. The diode of claim 7 wherein:
each cathode contact portion is aligned with a respective one of the second spaces.

11. The diode of claim 10, further comprising:
a first electrode that extends in a second direction that is transverse to the first direction, the first electrode in contact with ones of the anode regions at two different locations.

12. The diode of claim 11, further comprising a second electrode that extends in the second direction, the second electrode in contact with one of the cathode regions that is adjacent to the two different locations.

13. A gated diode semiconductor structure, comprising:
a semiconductor substrate of a first conductivity type;
a first doped region of a second conductivity type in the semiconductor substrate, the first doped region having first footprint area;
a second doped region of the first conductivity type in the semiconductor substrate and spaced from the first doped region, the second doped region having second footprint area;
a first insulation layer directly over the semiconductor substrate and positioned between the first and second doped regions;
a first electrode having a third footprint area less than the first insulation layer and positioned to directly overlay the first insulation layer;
a first metal member positioned directly over and being in electrical contact with the first doped region, the first metal member having a fourth footprint area that is the same as the first footprint area of the first doped region;
a second metal member positioned directly over and being in electrical contact with the second doped region, the second metal member having a fifth footprint area that is the same as the second footprint area of the second doped region;
an electrical connection between the second doped region and the first electrode.

14. The gated diode of claim 13 wherein the first electrode is comprised of a polysilicon.

15. The gated diode of claim 13 wherein the first and second metal members are composed of the same metal layer.

16. The gated diode of claim 13 further including:
a third doped region of the first conductivity type of doping positioned in the semiconductor substrate spaced from the first doped region and positioned on a different side of the first doped region than the second doped region, the third doped region having a sixth footprint area;
a second insulation layer directly over the semiconductor substrate and positioned between the first and third doped regions;
a second electrode having a seventh footprint area less than the second insulation layer and positioned to directly overlay the second insulation layer;
a third metal member positioned directly over and being in electrical contact with the third doped region, the third metal member having an eighth footprint area that is the same as the sixth footprint area of the third doped region;
an electrical connection between the third doped region and the second electrode.

17. The gated diode of claim 13 wherein the first doped region is a cathode and the second doped region is an anode.

18. The gated diode of claim 13 further including
a plurality of first doped regions of the second conductivity type of doping positioned in the semiconductor substrate adjacent to the first doped region;
a plurality of second doped regions of the first conductivity type of doping positioned in the semiconductor substrate spaced from the first doped region;
a first metal strip extending from the first metal member that is positioned directly over and being in electrical contact with the first doped region, the first metal strip connecting to a plurality of first metal members extending over the plurality of first doped members;
a second metal strip extending from the second metal member positioned that is directly over and being in electrical contact with the second doped region, the second metal member connecting to a plurality of second metal members extending over the plurality of first doped members.

* * * * *

UNITED STATES PATENT AND TRADEMARK OFFICE
CERTIFICATE OF CORRECTION

PATENT NO. : 11,171,131 B2
APPLICATION NO. : 16/544206
DATED : November 9, 2021
INVENTOR(S) : Vishal Kumar Sharma It is certified that error appears in the above-identified patent and that said Letters Patent is hereby corrected as shown below:

In the Claims

<u>Column 23, Claim 8, Line 24:</u>
"metal laver;" should read: -- metal layer; --.

<u>Column 24, Claim 18, Line 49:</u>
"including" should read: -- including: --.

Signed and Sealed this
Seventh Day of June, 2022

Katherine Kelly Vidal
*Director of the United States Patent and Trademark Office*